(12) United States Patent
Wang et al.

(10) Patent No.: US 10,573,439 B2
(45) Date of Patent: Feb. 25, 2020

(54) MULTILAYER IRON NITRIDE HARD MAGNETIC MATERIALS

(71) Applicant: Regents of the University of Minnesota, Minneapolis, MN (US)

(72) Inventors: Jian-Ping Wang, Shoreview, MN (US); Yanfeng Jiang, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 165 days.

(21) Appl. No.: 15/501,697

(22) PCT Filed: Aug. 5, 2015

(86) PCT No.: PCT/US2015/043845
§ 371 (c)(1),
(2) Date: Feb. 3, 2017

(87) PCT Pub. No.: WO2016/022711
PCT Pub. Date: Feb. 11, 2016

(65) Prior Publication Data
US 2017/0243680 A1    Aug. 24, 2017

Related U.S. Application Data

(60) Provisional application No. 62/035,230, filed on Aug. 8, 2014.

(51) Int. Cl.
*H01F 1/059*     (2006.01)
*H01F 41/22*     (2006.01)
(Continued)

(52) U.S. Cl.
CPC ............. *H01F 1/059* (2013.01); *C23C 16/34* (2013.01); *C23C 16/56* (2013.01); *H01F 41/22* (2013.01); *H02K 1/02* (2013.01)

(58) Field of Classification Search
None
See application file for complete search history.

(56) References Cited

U.S. PATENT DOCUMENTS

| 5,032,947 | A | 7/1991 | Li et al. |
| 5,068,147 | A | 11/1991 | Hori et al. |

(Continued)

FOREIGN PATENT DOCUMENTS

| CN | 1156516 A | 8/1997 |
| CN | 1621549 A | 6/2005 |

(Continued)

OTHER PUBLICATIONS

Fratczak et al: "Growth and 1-4,6-30 characterization of epitaxial iron-nitride thin f', Journal of Alloys and Compounds, vol. 586, Oct. 9, 2013 (Oct. 9, 2013), pp. 375-379, XP028788289.

(Continued)

*Primary Examiner* — Kevin M Bernatz
(74) *Attorney, Agent, or Firm* — Baker & Hostetler LLP

(57) ABSTRACT

The disclosure describes multilayer hard magnetic materials including at least one layer including $\alpha''$-$Fe_{16}N_2$ and at least one layer including $\alpha''$-$Fe_{16}(N_xZ_{1-x})_2$ or a mixture of $\alpha''$-$Fe_{16}N_2$ and $\alpha''$-$Fe_{16}Z_2$, where Z includes at least one of C, B, or O, and x is a number greater than zero and less than one. The disclosure also describes techniques for forming multilayer hard magnetic materials including at least one layer including $\alpha''$-$Fe_{16}N_2$ and at least one layer including $\alpha''$-$Fe_{16}(N_xZ_{1-x})_2$ or a mixture of $\alpha''$-$Fe_{16}N_2$ and $\alpha''$-$Fe_{16}Z_2$ using chemical vapor deposition or liquid phase epitaxy.

32 Claims, 8 Drawing Sheets

(51) Int. Cl.
    *C23C 16/34* (2006.01)
    *C23C 16/56* (2006.01)
    *H02K 1/02* (2006.01)

(56) References Cited

U.S. PATENT DOCUMENTS

| | | | |
|---|---|---|---|
| 5,137,588 A | 8/1992 | Wecker et al. | |
| 5,330,554 A | 7/1994 | Koyano et al. | |
| 5,449,417 A | 9/1995 | Shimizu et al. | |
| 6,139,765 A | 10/2000 | Kitazawa et al. | |
| 6,217,672 B1 | 4/2001 | Zhang | |
| 6,319,485 B1 | 11/2001 | Nagatomi et al. | |
| 6,457,629 B1 | 10/2002 | White | |
| 6,778,358 B1 | 8/2004 | Jiang et al. | |
| 6,841,259 B1* | 1/2005 | Takahashi | B82Y 10/00 428/812 |
| 7,238,439 B2 | 7/2007 | Sasaki et al. | |
| 9,715,957 B2* | 7/2017 | Wang | H01F 1/055 |
| 10,002,694 B2* | 6/2018 | Wang | H01F 1/0302 |
| 10,027,356 B2* | 7/2018 | Banin | H04B 1/0475 |
| 10,068,689 B2* | 9/2018 | Wang | B32B 15/011 |
| 2002/0117102 A1 | 8/2002 | Takahashi et al. | |
| 2002/0191354 A1 | 12/2002 | Yoshikawa et al. | |
| 2002/0197530 A1 | 12/2002 | Tani et al. | |
| 2004/0247859 A1 | 12/2004 | Sasaki et al. | |
| 2005/0208320 A1 | 9/2005 | Masada et al. | |
| 2006/0105170 A1 | 5/2006 | Dobson et al. | |
| 2006/0112873 A1 | 6/2006 | Uchida et al. | |
| 2008/0166584 A1 | 7/2008 | Deligianni et al. | |
| 2009/0042063 A1 | 2/2009 | Inoue et al. | |
| 2009/0087688 A1 | 4/2009 | Masaki | |
| 2010/0035086 A1 | 2/2010 | Inoue et al. | |
| 2010/0104767 A1 | 4/2010 | Sskuma et al. | |
| 2010/0288964 A1 | 11/2010 | Pirich et al. | |
| 2011/0059005 A1 | 3/2011 | Sankar et al. | |
| 2011/0074531 A1 | 3/2011 | Yamashita et al. | |
| 2012/0090543 A1 | 4/2012 | Cheong | |
| 2012/0145944 A1 | 6/2012 | Komuro et al. | |
| 2012/0153212 A1 | 6/2012 | Liu | |
| 2013/0126775 A1 | 5/2013 | Abe et al. | |
| 2013/0140076 A1 | 6/2013 | Lee et al. | |
| 2014/0001398 A1 | 1/2014 | Takahaski et al. | |
| 2014/0132376 A1* | 5/2014 | Jin | H01F 1/0552 335/302 |
| 2014/0290434 A1 | 10/2014 | Matthiesen | |
| 2014/0299810 A1 | 10/2014 | Wang et al. | |
| 2015/0380135 A1 | 12/2015 | Wang et al. | |
| 2015/0380158 A1 | 12/2015 | Brady et al. | |
| 2016/0042846 A1 | 2/2016 | Wang et al. | |
| 2016/0042849 A1 | 2/2016 | Wang et al. | |
| 2016/0141082 A1* | 5/2016 | Wang | H01F 1/047 148/101 |
| 2017/0186518 A1* | 6/2017 | Wang | H01F 1/0054 |

FOREIGN PATENT DOCUMENTS

| | | |
|---|---|---|
| CN | 101681706 | 3/2010 |
| CN | 102893715 | 1/2013 |
| CN | 103339694 A | 10/2013 |
| CN | 103827986 A | 5/2014 |
| CN | 105849834 A | 6/2014 |
| EP | 0509361 A2 | 10/1992 |
| EP | 0633581 A1 | 1/1995 |
| EP | 0994493 A2 | 4/2000 |
| EP | 1548760 A2 | 6/2005 |
| EP | 1675133 A2 | 6/2006 |
| EP | 2492927 A1 | 8/2012 |
| EP | 2666563 A1 | 11/2013 |
| EP | 2696356 A1 | 2/2014 |
| JP | S61143557 A | 7/1986 |
| JP | S61157634 A | 7/1986 |
| JP | S62232101 A | 10/1987 |
| JP | S63132701 A | 6/1988 |
| JP | H02173209 A | 7/1990 |
| JP | H02212320 A | 8/1990 |
| JP | H03100124 A | 4/1991 |
| JP | H04217305 A | 8/1992 |
| JP | H05269503 A | 10/1993 |
| JP | H05311390 A | 11/1993 |
| JP | H05326239 A | 12/1993 |
| JP | 06-020834 A | 1/1994 |
| JP | H0696947 A | 4/1994 |
| JP | H06267722 A | 9/1994 |
| JP | H06311390 A | 11/1994 |
| JP | 2000176513 A | 6/2000 |
| JP | 2001135508 A | 5/2001 |
| JP | 2001176715 A | 6/2001 |
| JP | 2002334695 A | 11/2002 |
| JP | 2004319923 A | 11/2004 |
| JP | 2005183932 A | 7/2005 |
| JP | 2006155894 A | 6/2006 |
| JP | 2007070669 A | 3/2007 |
| JP | 2007273038 A | 10/2007 |
| JP | 2008311518 A | 12/2008 |
| JP | 2009259402 A | 11/2009 |
| JP | 2012190156 A | 10/2012 |
| JP | 2012493409 A | 10/2012 |
| JP | 2012246174 A | 12/2012 |
| JP | 2013069926 A | 4/2013 |
| JP | 2013080922 A | 5/2013 |
| JP | 2013102122 A | 5/2013 |
| JP | 2013-131643 A | 7/2013 |
| JP | 2014-207342 A | 10/2014 |
| KR | 1020120091091 A | 8/2012 |
| TW | 272293 B | 3/1996 |
| TW | I303072 B | 11/2008 |
| TW | 201249564 A | 12/2012 |
| TW | 201447934 A | 12/2014 |
| WO | WO 2011049080 A1 | 4/2011 |
| WO | WO 2012159096 A2 | 11/2012 |
| WO | WO 2013026007 A2 | 2/2013 |
| WO | WO 2013042721 A1 | 3/2013 |
| WO | WO 2013090895 A1 | 6/2013 |
| WO | WO 2014124135 A2 | 8/2014 |
| WO | WO 2014210027 A1 | 12/2014 |
| WO | WO 2015148810 A1 | 10/2015 |
| WO | WO 2016022685 A1 | 2/2016 |
| WO | WO 2016122711 A1 | 2/2016 |
| WO | WO 2016122712 A1 | 8/2016 |
| WO | WO 2016122971 A1 | 8/2016 |
| WO | WO 2016122987 A1 | 8/2016 |

OTHER PUBLICATIONS

Slater, "Electronic Structure of Alloys," Journal of Applied Physics, vol. 8, No. 6, Jun. 1937, 8 pp.

Kikkawa et al., "Fine Fe16N2 powder prepared by low-temperature nitridation," Materials Research Bulletin, vol. 43, ScienceDirect, Feb. 19, 2008, 8 pp.

Zayak et al., "First-principles investigations of homogenous lattice-distortive strain and shuffles in Ni2MnGA," Journal of Physics: Condensed Matter, vol. 15, No. 2, Jan. 22, 2003, 8 pp.

Bogaerts et al., "Monte Carlo simulation of an analytical glow discharge: motion of electrons, ions and fast neutrals in the cathode dark space," Spectrochimica Acta, vol. 50B, No. 1, Jan. 1995, 20 pp.

Gagnoud et al., "Electromagnetic Modelling of Induction Melting Devices in Cold Crucible," IEEE Transactions on Magnetics, vol. 24, No. 1, Jan. 1988, 5 pp.

Sakuma, "Electronic and Magnetic Structure of Iron Nitride, Fe16N2 (invited)," Journal of Applied Physics, vol. 79, No. 8, Apr. 15, 1996, 8 pp.

Becke, "Density-Functional Exchange-Energy Approximation With Correct Asymptotic Behavior," Physical Review A General Physics, vol. 38, No. 6, Sep. 15, 1988, 4 pp.

Floris et al., "Vibrational Properties of MnO and NiO from DFT + U-Based Density Functional Perturbation Theory," Physical Review B Condensed Matter, vol. 84, Oct. 2011, 6 pp.

Liechtenstein et al., "Density-Functional Theory and Strong Interactions: Orbital Ordering in Mott-Hubbard Insulators," Physical Review B Condensed Matter, vol. 52, No. 8, Aug. 15, 1995, 5 pp.

(56) References Cited

OTHER PUBLICATIONS

Vasil'Ev et al., "Structural and Magnetic Phase Transitions in Shape-Memory Alloys Ni2+xMn1-xGa," Physical Review B: Condensed Matter and Materials Physics, vol. 59. No. 2, Jan. 1, 1999, pp. 1113-1120.

Sozinov et al., "Crystal Structures and Magnetic Anisotropy Properties of Ni—Mn—Ga Martensitic Phases With Giant Magnetic-Field-Induced Strain," IEEE Transactions on Magnetics, vol. 38, No. 5, Sep. 2002, pp. 2814-2816.

Zayak et al., "Switchable Ni—Mn—Ga Heusler nanocrystals," Journal of Applied Physics vol. 104, No. 7, Oct. 2008, 6 pp.

Likhachev et al., "Modeling the Strain Response, Magneto-Mechanical Cycling Under the External Stress, Work Output and Energy Losses in Ni—Mn—Ga," Mechanics of Materials, vol. 38, May 2006 pp. 551-563.

Morisako et al., "Magnetic Anisotropy and Soft Magnetism of Iron Nitride Thin Films Prepared by Facing-Target Sputtering," Journal of Applied Physics, vol. 69, No. 8, Apr. 15, 1991, pp. 5619-5621.

Jordan et al., "Magnetic Fluid Hyperthermia (MFH): Cancer Treatment with AC Magnetic Field Induced Excitation of Biocompatible Superparamagnetic Nanoparticles," Journal of Magnetism and Magnetic Materials vol. 201, Jul. 1, 1999 pp. 413-419.

Chakrabarti et al., "Influence of Ni Doping on the Electronic Structure of Ni2MnGa," Physical Review B vol. 72, Aug. 5, 2005, 4 pp.

Kirby et al., "Anomalous ferromagnetism in TbMnO3 thin films," Journal of Applied Physics, vol. 105, No. 7, Apr. 2009, 5 pp.

"2014 Titans of Technology—Jian-Ping Wang," Minneapolis/St. Paul Business Journal, Sep. 19, 2014, 18 pp.

Brady et al., "The Formation of Protective Nitride Surfaces for PEM Fuel Cell Metallic Bipolar Plates," Journal of the Minerals, Aug. 2006, pp. 50-57.

Himmetoglu, et al., "First-Principles Study of Electronic and Structural Properties of CuO," Physical Review B. vol. 84, Sep. 14, 2011, 8 pp.

Wedel et al., "Low Temperature Crystal Structure of Ni—Mn—Ga Alloys," Journal of Alloys and Compounds, vol. 290, Aug. 30, 1999 pp. 137-143.

Min, "Enhancement of Fe Magnetic Moments in Ferromagnetic Fe16B2, Fe16C2, and Fe16N2," International Journal of Modern Physics B. vol. 7, No. 1-3, Jan. 1993, pp. 729-732.

Bozorth, "Atomic Moments of Ferromagnetic Alloys," The Physical Review, vol. 79, No. 5, Sep. 1, 1950. pp. 887.

Rong et al., "Fabrication of Bulk Nanocomposite Magnets Via Severe Plastic Deformation and Warm Compaction," Applied Physics Letters, vol. 96, No. 10, Mar. 8, 2010, 3 pp.

Lorenz et al., "Precise Determination of the Bond Percolation Thresholds and Finite-Size Scaling Corrections for the sc, fcc, and bcc Lattices," Physical Review E, vol. 57, No. 1, Jan. 1998, pp. 230-236.

Majkrzak, "Polarized Neutron Reflectometry," Physica B: Condensed Matter, vol. 173, No. 1 & 2, Aug. 1991, 16 pp.

Opeil et al., "Combined Experimental and Theoretical Investigation of the Premartensitic Transition in Ni2MnGa," Physical Review Letters, vol. 100, Apr. 25, 2008, 4 pp.

Gao et al., "Quantitative Correlation of Phase Structure With the Magnetic Moment in rf Sputtered Fe—N Films," Journal of Applied Physics, vol. 73, No. 10, May 15, 1993, pp. 6579-6581.

Ortiz et al., "Epitaxial Fe16N2 Films Grown by Sputtering," Applied Physics Letters, vol. 65. No. 21, Nov. 21, 1994, pp. 2737-2739.

Cheng et al., "Tempering of Iron-Carbon-Nitrogen Martensites," Metallurgical Transactions A: Physical Metallurgy and Materials Science, vol. 23A, No. 4, Apr. 1992, pp. 1129-1145.

Chikazumi, "Physics of Ferromagnetism," Oxford Science Publications, Ed. 2, 1997, pp. 199-203. (Applicant points out, in accordance with MPEP 609.04(a), that the year of publication, 1997, is sufficiently earlier than the effective U.S. filing date, Aug. 5, 2015, so that the particular month of publication is not in issue.).

Wehrenberg et al., "Shock Compression Response of α"-Fe16N2 Nanoparticles," Journal of Applied Physics, vol. 111, No. 8, Apr. 23, 2012, 8 pp.

Ceperley et al., "Ground State of the Electron Gas by a Stochastic Method," Physical Review Letters, vol. 45, No. 7, Aug. 18, 1980, pp. 566-569.

Borsa et al., "Phase Identification of Iron Nitrides and Iron Oxy-Nitrides with Mossbauer Spectroscopy," Hyperfine Interactions, vol. 151/152, Dec. 2003, pp. 31-48.

Cook, "Strain Induced Martensite Formation in Stainless Steel," Metallurgical Transactions A, vol. 18A, No. 2, Feb. 1987, pp. 201-210.

Sun et al., "Epitaxial Single Crystal Fe16N2 Films Grown by Facing Targets Sputtering," Journal of Applied Physics, vol. 79, No. 8, Apr. 15, 1996, pp. 5440-5442.

Ping et al., "Partitioning of Ga and Co Atoms in a Fe3B/Nd2Fe14B Nanocomposite Magnet," Journal of Applied Physics, vol. 83, No. 12, Jun. 15, 1998, pp. 7769-7775.

Scherlis et al., "Simulation of Heme Using DFT + U: A Step Toward Accurate Spin-State Energetics," The Journal of Physical Chemistry, vol. 111, No. 25, Apr. 21, 2007, pp. 7384-7391.

Jugovic et al., "A Review of Recent Developments in the Synthesis Procedures of Lithium Iron Phosphate Powders," Journal of Power Sources, vol. 190, Feb. 6, 2009, pp. 538-544.

Fullerton et al., "Structure and Magnetic Properties of Exchange-Spring Sm-Co/Co Superlattices," Applied Physics Letters vol. 72, No. 3, Jan. 19, 1998, pp. 380-382.

Van Voorthuysen et al., "Low-Temperature Extension of the Lehrer Diagram and the Iron-Nitrogen Phase Diagram," Metallurgical and Materials Transactions A: Physical Metallurgy and Materials Science, vol. 33A, No. 8, Aug. 2002, pp. 2593-2598.

Kita et al., "Magnetic Properties of Core-Shell Type Fe16N2 Nanoparticles," Journal of Magnetism and Magnetic Materials, vol. 310, Nov. 21, 2006, pp. 2411-2413.

Kneller et al., "The Exchange-Spring Magnet: A New Material Principle for Permanent Magnets," IEEE Transaction on Magnetics, vol. 27, No. 4, Jul. 1991, pp. 3588-3600.

Lavernia et al., "The Rapid Solidification Processing of Materials: Science, Principles, Technology, Advances, and Applications," Journal of Material Science, vol. 45, Dec. 1, 2009, pp. 287-325.

Casoli et al., "Exchange-Coupled FePt/Fe Bilayers with Perpendicular Magnetization," IEEE Transactions on Magnetics, vol. 41, No. 10, Oct. 2005, pp. 3877-3879.

Zhou et al., "Phase Separation in LixFePO4 Induced by Correlation Effects," Physical Review B, vol. 69, May 12, 2004, 4 pp.

Zhou et al., "First-Principles Prediction of Redox Potentials in Transition-Metal Compounds with LDA+U," Physical Review B. vol. 70, Dec. 20, 2004, 8 pp.

Zhou et al., "The Li Intercalation Potential of LiMPO4 and LiMSiO4 Olivines with M=Fe, Mn, Co, Ni," Electrochemistry Communications, vol. 6, Sep. 25, 2004, pp. 1144-1148.

Zhou et al., "Configurational Electronic Entropy and the Phase Diagram of Mixed-Valence Oxides: The Case of LixFePO4," Physical Review Letters, vol. 97, Oct. 13, 2006, 4 pp.

Herzer, "Grain Size Dependence of Coercivity and Permeability in Nanocrystalline Ferromagnets," IEEE Transactions on Magnetics, vol. 26, No. 5, Sep. 1990, pp. 1397-1402.

Ludtka et al., "In Situ Evidence of Enhanced Transformation Kinetics in a Medium Carbon Steel Due to a High Magnetic Field," Scripta Materialia, vol. 51, Apr. 20, 2004, pp. 171-174.

Felcher, "Neutron Reflection as a Probe of Surface Magnetism," Physical Review B: Condensed Matter, vol. 24, No. 3, Aug. 1, 1981, pp. 1595-1598.

Speich et al., "Elastic Constants of Binary Iron-Base Alloys," Metallurgical Transactions, vol. 3, No. 8, Aug. 1972, pp. 2031-2037.

Fernando et al., "Magnetic Moment of Iron in Metallic Environments," Physical Review B, vol. 61, No. 1, Jan. 1, 2000, pp. 375-381.

Felcher, "Magnetic Depth Profiling Studies by Polarized Neutron Reflection," Physica B: Condensed Matter, vol. 192, Nos. 1 & 2, Oct. 1993, pp. 137-149.

(56) References Cited

OTHER PUBLICATIONS

Gaunt, "The Magnetic Properties of Platinum Cobalt Near the Equiatomic Composition Part II. Mechanism of Magnetic Hardening," The Philosophical Magazine, vol. 13, No. 123, Mar. 1966, pp. 579-588.

Takahashi et al., "α"-Fe16N2 Problem—Giant Magnetic Moment or Not," Journal of Magnetism and Magnetic Materials, vol. 208, No. 3, Jan. 11, 2000, pp. 145-157.

Shokrollahi et al., "Soft Magnetic Composite Materials (SMCs)," Journal of Materials Processing Technology, vol. 189, Feb. 20, 2007, pp. 1-12.

Sugita et al., "Magnetic and Electrical Properties of Single-Phase, Single-Crystal Fe16N2 Films Epitaxially Grown by Molecular Beam Epitaxy (Invited)," Journal of Applied Physics, vol. 79, No. 8, Apr. 15, 1996, pp. 5576-5581.

Takahashi et al., "Perpendicular Uniaxial Magnetic Anisotropy of Fe16N2(001) Single Crystal Films Grown by Molecular Beam Epitaxy," IEEE Transactions on Magnetics, vol. 35, No. 5, Sep. 1999, pp. 2982-2984.

Tanaka et al., "Electronic Band Structure and Magnetism of Fe16N2 Calculated by the FLAPW Method," Physical Review B: Condensed Matter and Materials Physics, vol. 62, No. 22, Dec. 1, 2000, pp. 15042-15046.

Zeng et al., "Exchange-Coupled Nanocomposite Magnets by Nanoparticle Self-Assembly," Nature, vol. 420, No. 6914, Nov. 28, 2002, pp. 395-398.

Du, "A Reevaluation of the Fe—N and Fe—C—N Systems," Journal of Phase Equilibria, vol. 14, No. 6, Aug. 24, 1993, pp. 682-693.

Jiang et al., "The Thermostability of the Fe16N2 Phase Deposited on a GaAs Substrate by Ion-Bean-Assisted Deposition," Journal of Physical Condensed Matter, vol. 6, Mar. 17, 1994, pp. L279-L282.

Jan et al., "Monte Carlo Simulations of Spin-1/2 Micelle and Microemulsion Models," Journal De Physique, vol. 49, No. 4, Apr. 1988, pp. 623-633.

Nelson, "Epitaxial Growth From the Liquid State and Its Application to the Fabrication of Tunnel and Laser Diodes," RCA Review, vol. 24, No. 4, Dec. 1963, pp. 603-615.

Shinno et al., "Effects of Film Thickness on Formation Processes of Fe16N2 in Nitrogen Ion-Implanted Fe Films," Surface and Coatings Technology vol. 103-104, May 1998, pp. 129-134.

Takahashi et al., "Ferromagnetic Resonance Studies of Fe16N2 Films with a Giant Magnetic Moment," Journal of Applied Physics, vol. 73, No. 10, May 15, 1993, pp. 6060-6062.

Shimba et al., "Preparation of Iron Nitride Fe16N2 Nanoparticles by Reduction of Iron Nitrate," J. Japan Inst. Metals, vol. 74, No. 3, 2010, 5 pp. (Applicant points out, in accordance with MPEP 609.04(a), that the year of publication, 2010, is sufficiently earlier than the effective U.S. filing date, Aug. 5, 2015, so that the particular month of publication is not in issue.).

Hook et al., "Magnetic Order," Solid State Physics, Ed. 2, Ch. 8, 1991, pp. 219-252. (Applicant points out, in accordance with MPEP 609.04(a), that the year of publication, 1991, is sufficiently earlier than the effective U.S. filing date, Aug. 5, 2015, so that the particular month of publication is not in issue.).

Hsu et al., "First-Principles Study for Low-Spin LaCoO3 with a Structurally Consistent Hubbard U," Physical Review B, vol. 79, Mar. 31, 2009, 9 pp.

Hsu et al., "Spin-State Crossover and Hyperfine Interactions of Ferric Iron in MgSiO3 Perovskite," Physical Review Letters, vol. 106, Mar. 18, 2011, 4 pp.

McCurrie, "Chapter 3: The Structure and Properties of Alinco Permanent Magnet Alloys," Handbook of Ferromagnetic Materials, vol. 3, 1982, 82 pp. (Applicant points out, in accordance with MPEP 609.04(a), that the year of publication, 1982, is sufficiently earlier than the effective U.S. filing date, Aug. 5, 2015, so that the particular month of publication is not in issue.).

Kulik et al., "Density Functional Theory in Transition-Metal Chemistry: A Self-Consistent Hubbard U Approach," Physical Review Letters, vol. 97, Sep. 8, 2006, 4 pp.

BAE et al., "Cost Effective Parallel-Branch Spiral Inductor with Enhanced Quality Factor and Resonance Frequency," Electronics and Telecommunications Research Institute, 2007, pp. 87-90. (Applicant points out, in accordance with MPEP 609.04(a), that the year of publication, 2007, is sufficiently earlier than the effective U.S. filing date, Aug. 5, 2015, so that the particular month of publication is not in issue.).

Galanakis et al., "Spin-Polarization and Electronic Properties of Half-Metallic Heusler Alloys Calculated from First Principles," Journal of Physics: Condensed Matter, vol. 19, No. 31, Jul. 3, 2007 (online), 16 pp.

Al-Omari et al., "Magnetic Properties of Nanostructured CoSm/FeCo Films," Physical Review B, vol. 52, No. 5, Aug. 1, 1995, pp. 3441-3447.

Mazin et al., "Insulating Gap in FeO: Correlations and Covalency," Physical Review B, vol. 55, No. 19, May 15, 1997, pp. 12822-12825.

Solovyev et al., "Corrected Atomic Limit in the Local-Density Approximation and the Electronic Structure of d Impurities in Rb," Physical Review B, vol. 50, No. 23, Dec. 15, 1994, pp. 16861-16871.

Campos et al., "Evaluation of the Diffusion Coefficient of Nitrogen in Fe4N1-x Nitride Layers During Microwave Post-Discharge Nitriding," Applied Surface Science, vol. 249, Dec. 30, 2004, pp. 54-59.

Issakov et al., "Fast Analytical Parameters Fitting of Planar Spiral Inductors," 2008 IEEE International Conference on Microwaves, Communications, Antennas and Electronic Systems, May 13-14, 2008, 10 pp.

Borchers et al., "Observation of Antiparallel Magnetic Order in Weakly Coupled Co/Cu Multilayers," Physical Review Letters, vol. 82, No. 13, Mar. 29, 1999, pp. 2796-2799.

Takahashi et al., "Structure and Magnetic Moment of α"-Fe16N2 Compound Films: Effect of Co and H on Phase Formation (Invited)," Journal of Applied Physics, vol. 79, No. 8, Apr. 15, 1996, pp. 5564-5569.

Buschbeck et al., "Full Tunability of Strain Along the fcc-bcc Bain Path in Epitaxial Films and Consequences for Magnetic Properties," Physical Review Letters, vol. 103, Nov. 20, 2009, 4 pp.

Chakhalian et al., "Magnetism at the Interface Between Ferromagnetic and Superconducting Oxides," Nature Physics, vol. 2, Apr. 1, 2006, pp. 244-248.

Cui et al., "Phase Transformation and Magnetic Anisotropy of an Iron-Palladium Ferromagnetic Shape-Memory Alloy," Acta Materialia, vol. 52, No. 1, Jan. 5, 2004, 35-47.

Davies et al., "Anisotropy Dependence of Irreversible Switching in Fe/SmCo and FeNi/FePt Exchange Spring Magnet Films," Applied Physics Letters, vol. 86, No. 26, Jun. 27, 2005, 3 pp.

Herbst et al., "Neodymium-Iron-Boron Permanent Magnets," Journal of Magnetism and Magnetic Materials, vol. 100, Nos. 1-3, Nov. 1991, pp. 57-78.

Fidler et al., "Recent Developments in Hard Magnetic Bulk Materials," Journal of Physics: Condensed Matter, vol. 16, Jan. 23, 2004, pp. 455-470.

Haenl et al., "Room-Temperature Ferroelectricity in Strain SrTiO3," Nature, vol. 430, Aug. 12, 2004, pp. 758-761.

Hoppler et al., "Giant Superconductivity-Induced Modulation of the Ferromagnetic Magnetization in a Cuprate-Manganite Superlattice," Nature Materials, vol. 8, Apr. 2009, pp. 315-319.

Coey, "The Magnetization of Bulk α"-Fe16N2 (Invited)," Journal of Applied Physics, vol. 76, No. 19, Nov. 15, 1994, pp. 6632-6636.

Coey et al., "The Magnetization of α"-Fe16N2," Journal of Physics: Condensed Matter, vol. 6, Sep. 27, 1993, pp. 23-28.

Coey, "Magic Moments in Magnetism," Physics World, vol. 6, No. 8, Aug. 1993, pp. 25-26.

Qiu et al., "Tuning the Crystal Structure and Magnetic Properties of FePt Nanomagnets," Advanced Materials, vol. 19, Jun. 6, 2007, pp. 1703-1706.

Wang, "FePt Magnetic Nanoparticles and Their Assembly for Future Magnetic Media," Proceedings of the IEEE, vol. 96, No. 11, Nov. 2008, pp. 1847-1863.

Qiu et al., "Monodispersed and Highly Ordered L10 FePt Nanoparticles Prepared in the Gas Phase," Applied Physics Letters, vol. 88, May 9, 2006, 3 pp.

(56) References Cited

OTHER PUBLICATIONS

Qiu et al., "In Situ Magnetic Field Alignment of Directly Ordered L10 FePt Nanoparticles," Applied Physics Letters, vol. 89, Nov. 29, 2006, 3 pp.

Liu et al., "High Energy Products in Rapidly Annealed Nanoscale Fe/Pt Multilayers," Applied Physics Letters, vol. 72, No. 4, Jan. 26, 1998, pp. 483-485.

Wang et al., "Fabrication of Fe16N2 Films by Sputtering Process and Experimental Investigation of Origin of Giant Saturation Magnetization in Fe16N2," IEEE Transactions on Magnetics, vol. 48, No. 5, May 2012, pp. 1710-1717.

Shi et al., "Diamond-Like Carbon Films Prepared by Facing-Target Sputtering," Thin Solid Films, Vols. 420-421, Dec. 2, 2002, pp. 172-175.

Jiang et al., "Improving Exchange-Spring Nanocomposite Permanent Magnets," Applied Physics Letters, vol. 85, No. 22, Nov. 29, 2004, pp. 5293-5295.

Zhou et al., "Permanent-Magnet Properties of Thermally Processed FePt and FePt—Fe Multilayer Films," IEEE Transactions on Magnetics, vol. 38, No. 5, Sep. 2002, pp. 2802-2804.

MacLaren, "Role of Alloying on the Shape Memory Effect in Ni2MnGa," Journal of Applied Physics, vol. 91, No. 10, May 15, 2002, pp. 7801-7803.

Perdew et al., "Self-Interaction Correction to Density-Functional Approximations for Many-Electron Systems," Physical Review B, vol. 23, No. 10, May 15, 1981, pp. 5048-5079.

Dong et al., "Shape Memory and Ferromagnetic Shape Memory Effects in Single-Crystal Ni2MnGa Thin Films," Journal of Applied Physics, vol. 95, No. 5, Mar. 1, 2004, pp. 2593-2600.

Bland et al., "Ferromagnetic Moments in Metastable Magnetic Films by Spin-Polarized-Neutron Reflection," Physical Review Letters, vol. 58, No. 12, Mar. 23, 1987, pp. 1244-1247.

Bland et al., "Layer Selective Magnetometry in Ultrathin Magnetic Structures by Polarised Neutron Reflection," Journal of Magnetism and Magnetic Materials, vol. 165, Jun. 1997, pp. 46-51.

Ji et al., "Elemental Specific Study on FeCo—Au nanoparticles," Bulletin of the American Physical Society, APS Meeting 2010, vol. 55, No. 2, Mar. 15-19, 2010, 1 pp.

Coey, "Permanent Magnet Applications" Journal of Magnetism and Magnetic Materials, vol. 248, Apr. 24, 2002, pp. 441-456.

Zhang et al., "Polarizer angular dependence of spin transfer oscillation in magnetic tunnel junction," Bulletin of the American Physical Society, APS Meeting 2010, vol. 55, No. 2, Mar. 15-19, 2010, 1 pp.

Kronmüller et al., "Micromagnetic Analysis of the Magnetic Hardening Mechanisms in Re—Fe—B Magnets," Journal De Physique, C8, No. 12, Tome 49, Dec. 1988, 6 pp.

Tang et al., "Formation of Nanocrystalline Fe—N—B—Cu Soft Magnetic Ribbons," Journal of Non-Crystalline Solids, vol. 337, Sep. 9, 2003, pp. 276-279.

Chen et al., "Modeling of On-Chip Differential Inductors and Transformers/Baluns," IEEE Transactions on Electron Devices, vol. 54, No. 2, Feb. 2007, pp. 369-371.

Ji et al., "N Site Ordering Effect on Partially Ordered Fe16N2," Applied Physics Letters, vol. 98, No. 9, Feb. 28, 2011, 3 pp.

Ji et al., "Epitaxial High Saturation Magnetization FeN Thin Films on Fe(001) Seeded GaAs(001) Single Crystal Wafer Using Facing Target Sputterings," Journal of Applied Physics, vol. 109, No. 7, Apr. 2011, 6 pp.

Ji et al., "Theory of Giant Saturation Magnetization in α"-Fe16N2: Role of Partial Localization in Ferromagnetism of 3d Transition Metals," New Journal of Physics, vol. 12, Jun. 17, 2010, 8 pp.

Cho, "The Best Refrigerator Magnet Ever?," Science/AAAD News, Science Now, Mar. 19, 2010, retrieved from the internet http://news.sciencemag.org/physics/2010/03/best-refrigerator-magnet-ever?sms_ss=email, 2 pp.

Ji et al., "Perpendicular Magnetic Anisotropy and High Spin-Polarization Ratio in Epitaxial Fe—N Thin Films," Physical Review B, vol. 84, Dec. 14, 2011, 8 pp.

Ziegler, "SRIM—The Stopping and Range of Ions in Matter," retrieved from http://srim.org/ on Oct. 13, 2016, 4 pp.

Jiang et al., "FeN Foils by Nitrogen Ion-Implantation," Journal of Applied Physics, vol. 115, Mar. 12, 2014, 3 pp.

Jiang et al., "9 T High Magnetic Field Annealing Effects on FeN Bulk Sample," Journal of Applied Physics, vol. 115, Mar. 13, 2014, 3 pp.

"International Energy Outlook 2013," U.S. Energy Information Administration, Jul. 2013, 312 pp.

Croat, "Current Status of Rapidly Solidified Nd—Fe—B Permanent Magnets," IEEE Transactions on Magnetics, vol. 25, No. 5, Sep. 1989, pp. 3550-3554.

Perdew et al., "Generalized Gradient Approximation Made Simple," Physical Review Letters, vol. 77, No. 18, Oct. 28, 1996, pp. 3865-3868.

Guo et al., "A Broadband and Scalable Model for On-Chip Inductors Incorporating Substrate and Conductor Loss Effects," IEEE Radio Frequency Integrated Circuits Symposium, Jun. 12-14, 2005, pp. 593-596.

Jack, "The Occurrence and the Crystal Structure of α"-Iron Nitride; a New Type of Interstitial Alloy Formed During the Tempering of Nitrogen-Martensite," Proceedings of the Royal Society of London, vol. 208, Sep. 24, 1951, pp. 216-224.

Jack, "The Iron-Nitrogen System: The Preparation and the Crystal Structures of Nitrogen-Austenite (γ) and Nitrogen-Martensite (60 ')*," Proceedings of the Royal Society of London, Mar. 13, 1951, pp. 200-217.

Yamanaka et al., "Humidity Effects in Fe16N2 Fine Powder Preparation by Low-Temperature Nitridation," Journal of Solid State Chemistry, vol. 183, Aug. 4, 2010, pp. 2236-2241.

Frisk, "A New Assessment of the Fe—N Phase Diagram" Calphad, vol. 11, No. 2, 1987, pp. 127-134. (Applicant points out, in accordance with MPEP 609.04(a), that the year of publication, 1987, is sufficiently earlier than the effective U.S. filing date, Aug. 5, 2015, so that the particular month of publication is not in issue.).

Nakajima et al., "Large Magnetization Induced in Single Crystalline Iron Films by High-Dose Nitrogen Implantation," Applied Physics Letters, vol. 56, No. 1, Jan. 1, 1990, pp. 92-94.

Nakajima et al., "Nitrogen-Implantation-Induced Transformation of Iron to Crystalline Fe16N2 in Epitaxial Iron Films," Applied Physics Letters, vol. 54, No. 25, Jun. 19, 1989, pp. 2536-2538.

Nakajima et al., "Formation of Ferromagnetic Iron Nitrides in Iron Thin Films by High-Dose Nitrogen Ion Implantation," Journal of Applied Physics, vol. 65, No. 11, Jun. 1, 1989, pp. 4357-4361.

Kaneko et al., "Fe—Cr—Co Ductile Magnet With (BH)max = 8 MGOe," AIP Conference Proceedings, 1976, 2 pp. (Applicant points out, in accordance with MPEP 609.04(a), that the year of publication, 1976, is sufficiently earlier than the effective U.S. filing date, Aug. 5, 2015, so that the particular month of publication is not in issue.).

Strnat, "Modern Permanent Magnets for Applications in Electro-Technology," Proceedings of the IEEE, vol. 78, No. 6, Jun. 1990, pp. 923-946.

Strnat et al., "Bonded Rare Earth-Cobalt Permanent Magnets," Proceedings of the 12$^{th}$ Rare Earth Research Conference, vol. 1, Jul. 18-22, 1976, 11 pp.

Strnat et al., "Rare Earth-Cobalt Permanent Magnets," Journal of Magnetism and Magnetic Materials, vol. 100, Nos. 1-3, Nov. 1991, pp. 38-56.

Yang et al., "The Effect of Strain Induced by Ag Underlayer on Saturation Magnetization of Partially Ordered Fe16N2 Thin Films," Applied Physics Letters, vol. 103, Dec. 12, 2013, 4 pp.

Lewis et al., "Perspectives on Permanent Magnetic Materials for Energy Conversion and Power Generation," Metallurgical and Materials Transactions A, vol. 44A, Jan. 2013, 19 pp.

Pauling, "The Nature of the Interatomic Forces in Metals," Physical Review, vol. 54, Dec. 1, 1938, pp. 899-904.

Davison et al., "Shock Compression of Solids," Physics Reports, vol. 55, No. 4, Apr. 1979, pp. 255-379.

Liu et al., "Nanocomposite Exchange-Spring Magnet Synthesized by Gas Phase Method: From Isotropic to Anisotropic," Applied Physics Letters, vol. 98, Jun. 3, 2011, 3 pp.

(56) References Cited

OTHER PUBLICATIONS

Liu et al., "Discovery of localized states of Fe 3D electrons in Fe16N2 and Fe8N films: an evidence of the existence of giant saturation magnetization," arXiv: 0909.4478, Sep. 2009, 13 pp.
Amato et al., "Exchange-Spring Behavior of Hard/Soft Magnetic Multilayers: Optimization Study of the Nanostructure," Physica B: Condensed Matter, vol. 275, Nos. 1-3, Jan. 2000, pp. 120-123.
Tijssens et al., "Towards an Improved Continuum Theory for Phase Transformations," Materials Science and Engineering, vol. 378, Sep. 23, 2003, pp. 453-458.
Komuro et al., "Epitaxial Growth and Magnetic Properties of Fe16N2 Films with High Saturation Magnetic Flux Density (Invited)," Journal of Applied Physics, vol. 67, No. 9, May 1, 1990, pp. 5126-5130.
Brady et al., "Alloy Design of Intermetallics for Protective Scale Formation and for use as Precursors for Complex Ceramic Phase Surfaces," Intermetallics, vol. 12, Apr. 1, 2004, pp. 779-789.
Brady et al., "Pre-Oxidized and Nitrided Stainless Steel Alloy Foil for Proton Exchange Membrane Fuel Cell Bipolar Plates: Part 1. Corrosion, Interfacial Contact Resistance, and Surface Structure," Journal of Power Sources, vol. 195, Mar. 20, 2010, pp. 5610-5618.
"Annual Energy Outlook 2015, with projects to 2040," U.S. Energy Information Administration, Apr. 2015, 154 pp.
Kim et al., "New Magnetic Material Having Ultrahigh Magnetic Moment," Applied Physics Letters, vol. 20, No. 12, Jun. 15, 1972, pp. 492-494.
Zhuge et al., "Preparation and Property of Iron Nitrides by Ball Mill Method," Journal of Functional Materials, vol. 31, No. 5, 2000, pp. 471-472 (Abstract Only (on last page)) (Applicant points out, in accordance with MPEP 609.04(a), that the year of publication, 2000, is sufficiently earlier than the effective U.S. filing date, Aug. 5, 2015, so that the particular month of publication is not in issue.).
Takahashi et al., "Magnetic Moment of $\alpha''$-Fe16N2 Films (Invited)," Journal of Applied Physics, vol. 76, No. 10, Nov. 15, 1994, pp. 6642-6647.
Takahashi et al., "Structure and Magnetic Moment of Fe16N2 Sputtered Film," Journal of Magnetism and Magnetic Materials, vol. 174, Nos. 1-2, Oct. 1, 1997, pp. 57-69.
Takahashi et al., "Magnetocrystalline Anisotropy for $\alpha'$-Fe—C and $\alpha'$-Fe-N Films," IEEE Transactions on Magnetics, vol. 37, No. 4, Jul. 2001, pp. 2179-2181.
Mühlethaler et al., "Improved Core-Loss Calculation for Magnetic Components Employed in Power Electronic Systems," IEEE Transactions on Power Electronics, vol. 27, No. 2, Feb. 2012, pp. 964-973.
Watanabe et al., "Perpendicular Magnetization of Epitaxial FePt(001) Thin Films with High Squareness and High Coercive Force," Japanese Journal of Applied Physics, vol. 35, No. 10A, Oct. 1, 1996, pp. 1264-1267.
Zhang et al., "Thermal Stability of Partially Ordered Fe16N2 Film on Non-Magnetic Ag Under Layer," Journal of Applied Physics, vol. 115, No. 17A, Mar. 20, 2014, 3 pp.
Uijttewaal et al., "Understanding the Phase Transitions of the Ni2MnGa Magnetic Shape Memory System from First Principles," Physical Review Letters, vol. 102, Jan. 23, 2009, 4 pp.
Pugaczowa-Michalska et al., "Electronic Structure and Magnetic Properties of Ni2MnGa1-xGex and Disordered Ni2MnSn Heusler Alloys," Acta Physica Polonica A, vol. 115, No. 1, Jan. 2009, pp. 241-243.
Brewer et al., "Magnetic and Physical Microstructure of Fe16N2 Films Grown Epitaxially on Si(001)," Journal of Applied Physics, vol. 81, No. 8, Apr. 15, 1997, pp. 4128-4130.
Abdellateef et al., "Magnetic Properties and Structure of the $\alpha''$-Fe16N2 Films," Journal of Magnetism and Magnetic Materials, vol. 256, Nos. 1-3, Jan. 11, 2003, pp. 214-220.
Brewer et al., "Epitaxial Fe16N2 Films Grown on Si(001) by Reactive Sputtering," Journal of Applied Physics, vol. 79, No. 8, Apr. 15, 1996, pp. 5321-5323.
Van Genderen et al., "Atom Probe Analysis of the First Stage of Tempering of Iron-Carbon-Nitrogen Martensite," Zeitschrift Für Metallkunde, vol. 88, No. 5, May 1997, pp. 401-409.
Takahashi et al., "Impurity effect of carbon on structure and saturation magnetization of Fe—N films," Journal of Magnetism and Magnetic Materials, vol. 210, Sep. 1, 1999, pp. 333-340.
Huang et al., "Magnetism of $\alpha''$-FeN Alloys and 60 "-(Fe16N2) Fe Nitrides," Journal of Magnetism and Magnetic Materials, vol. 135, Nov. 30, 1993, pp. 226-230.
Huang et al., "Spin-Density Distribution in Ferromagnetic $\alpha''$-Fe16N2," Physical Review B: Condensed Matter, vol. 51, No. 5, Feb. 1, 1995, pp. 3222-3225.
Cococcioni et al., "Linear Response Approach to the Calculation of the Effective Interaction Parameters in the LDA+U Method," Physical Review B, vol. 71, Jan. 18, 2005, 16 pp.
Takahashi, "Discovery of Fe16N2 with Giant Magnetic Moment and Its Future View," IEEE Translation Journal on Magnetics in Japan, vol. 6, No. 12, Dec. 1991, pp. 1024-1038.
Zhang et al., "Strain Effect of Multilayer FeN Structure on GaAs Substrate," Journal of Applied Physics, vol. 113, No. 17, Apr. 10, 2013, 3 pp.
"New Compound Opens Way to EV Magnet without Rare Earths," Nikkei.com Morning Edition, Mar. 4, 2011, 1 pp.
Coey et al., "Magnetic nitrides," Journal of Magnetism and Magnetic Materials, vol. 200, Mar. 10, 1999, pp. 405-420.
Tomioka et al., "Iron Nitride Powder Produced as Substitute for Rare Metal," Nikkei Technology, Mar. 7, 2011, 2 pp.
Ji et al., "Direct Observation of Giant Saturation Magnetization in Fe16N2," arXiv: 1211.0553, Nov. 2012, 27 pp.
Zheng et al., "Iron Nitride Thin Films Deposited by Chloride Assisted Plasma Enhanced Chemical Vapour Deposition: Facile Stoichiometry Control and Mechanism Study," Journal of Applied Physics D: Applied Physics, vol. 42, No. 18, Sep. 21, 2009, 9 pp.
Ji et al., "Strain Induced Giant Magnetism in Epitaxial Fe16N2 Thin Film," Applied Physics Letters, vol. 102, Feb. 21, 2013, 4 pp.
Lanska et al., "Composition and Temperature Dependence of the Crystal Structure of Ni—Mn—Ga Alloys," Journal of Applied Physics, vol. 95, No. 12, Jun. 15, 2004, pp. 8074-8078.
Takahashi et al., "Growth Mechanism of FeN Films by Means of an Atmospheric Pressure Halide Chemical Vapor Deposition," Materials Chemistry and Physics, vol. 65, Jan. 18, 2000. pp. 113-116.
Ji et al., "Growth and Depth-Dependence of Saturation Magnetization of Iron Nitride Thin Films on MgO Substrate," Spin, vol. 2, No. 1, Mar. 2012, 4 pp.
"Nanocrystalline soft magnetic material, FINEMET," Materials Magic, Hiatchi Metals, Apr. 2005, 12 pp.
Gutfleisch et al., "Magnetic Materials and Devices for the 21$^{st}$ Century: Stronger, Lighter, and More Energy Efficient," Advanced Materials, vol. 23, 2011, Dec. 15, 2010, pp. 821-842.
Ferguson et al., "The Tempering of Fe—C—N Martensite" Scripta Metallurgica, vol. 18, No. 11, Nov. 1984, pp. 1189-1194.
Brown et al., "The Crystal Structure and Phase Transitions of the Magnetic Shape Memory Compound Ni2MnGa," Journal of Physics: Condensed Matter, vol. 14, No. 43, Oct. 18, 2002, pp. 10159-10171.
Bruno, "Tight-Binding Approach to the Orbital Magnetic Moment and Magnetocrystalline Anisotropy of Transition-Metal Monolayers," Physical Review B, vol. 39, No. 1, Jan. 1, 1989, pp. 865-868.
Blöchl, "Projector Augmented-Wave Method," Physical Review B, vol. 50, No. 24, Dec. 15, 1994, pp. 17953-17979.
Entel et al., "Ab Initio Modeling of Martensitic Transformation (MT) in Magnetic Shape Memory Alloys," Journal of Magnetism and Magnetic Materials, vol. 310, Nov. 27, 2006, pp. 2761-2763.
Hohenberg et al., "Inhomogeneous Electron Gas," Physical Review, vol. 136, No. 3B, Nov. 9, 1964, pp. 864-871.
Sit et al., "Realistic Quantitative Descriptions of Electron Transfer Reactions: Diabatic Free-Energy Surfaces from First-Principles Molecular Dynamics," Physical Review Letters, vol. 97, Jul. 11, 2006, 4 pp.
Paseka et al., "Structure and Magnetic Properties of Ball-Milled Iron Nitride Powders," Journal of Alloys and Compounds, vol. 274, Mar. 10, 1998, pp. 248-253.

(56) References Cited

OTHER PUBLICATIONS

Giannozzi et al., "Quantum Espresso: A Modular and Open-Source Software Project for Quantum Simulations of Materials," Journal of Physics: Condensed Matter, vol. 21, Sep. 1, 2009, pp. 1-19.
Tong et al., "Low Temperature Wafer Direct Bonding," Journal of Microelectromechanical Systems, vol. 3, No. 1, Mar. 1994, pp. 29-35.
Fan et al., "Ferromagnetism at the Interfaces of Antiferromagnetic FeRh Epilayers," Physical Review B, vol. 82, Nov. 12, 2010, 5 pp.
Yao et al., "Formation and Magnetic Properties of Fe16N2 Films Prepared by Ion-Beam-Assisted Deposition," Journal of Magnetism and Magnetic Materials, vol. 177-181, Jan. 1998, pp. 1291-1292.
Skomski et al., "Giant Energy Product in Nanostructured Two-Phase Magnets," Physical Review B, vol. 48, No. 21, Dec. 1, 1993, pp. 15812-15816.
Tickle et al., "Magnetic and Magnetomechanical Properties of Ni2MnGa," Journal of Magnetism and Magnetic Materials, vol. 195, No. 3, Jun. 11, 1999, pp. 627-638.
Sabiryanov et al., "Electronic Structure and Magnetic Properties of Hard/Soft Multilayers," Journal of Magnetism and Magnetic Materials, vol. 177-181, Pt. 2, Jan. 1998, pp. 989-990.
Metzger et al., "Magnetism of $\alpha''$-Fe16N2 (Invited)," Journal of Applied Physics, vol. 76, No. 10, Nov. 15, 1994, pp. 6626-6631.
Kardonina et al., "Transformations in the Fe—N System," Metal Science and Heat Treatment, vol. 52, Nos. 9-10, Oct. 2010, pp. 5-15.
Chu et al., "Opportunities and Challenges for a Sustainable Energy Future," Nature, vol. 488, No. 7411, Aug. 16, 2012, pp. 294-303.
Blundell et al., "Polarized Neutron Reflection as a Probe of Magnetic Films and Multilayers," Physical Review B, vol. 46, No. 6, Aug. 1, 1992, pp. 3391-3400.
Zhang et al., "Energy Barriers and Hysteresis in Martensitic Phase Transformations," Acta Materialia, vol. 57, Jul. 17, 2009, pp. 4332-4352.
Kikkawa et al., "Particle Size Dependence in Low Temperature Nitridation Reaction for Fe16N2," Journal of Alloys and Compounds, vol. 449, Dec. 21, 2006 (online), pp. 7-10.
Okamoto et al., "Crystal Distortion and the Magnetic Moment of Epitaxially Grown $\alpha''$-Fe16N2," Journal of Magnetism and Magnetic Materials, vol. 208, Jul. 12, 1999, pp. 102-114.
Roy et al., "Depth Profile of Uncompensated Spins in an Exchange Bias System," Physical Review Letters, vol. 95, Jul. 21, 2005, 4 pp.
Uchida et al., "Magnetocrystalline Anisotropy Energies of Fe16N2 and Fe16C2," Journal of Magnetism and Magnetic Materials, vol. 310, Nov. 15, 2006, pp. 1796-1798.
Wang et al., "Properties of a New Soft Magnetic Material," Nature, vol. 407, Sep. 14, 2000, pp. 150-151.
Dudarev et al., "Electron-Energy-Loss Spectra and the Structural Stability of Nickel Oxide: An LSDA+U Study," Physical Review B, vol. 57, No. 3, Jan. 15, 1998, pp. 1505-1509.
Kart et al., "DFT Studies on Structure, Mechanics and Phase Behavior of Magnetic Shape Memory Alloys: Ni2MnGa," Physica Status Solidi, vol. 205, No. 5, Mar. 20, 1998, pp. 1026-1035.
Barman et al., "Structural and Electronic Properties of Ni2MnGa," Physical Review B, vol. 72, Nov. 8, 2005, 7 pp.
Atiq et al., "Preparation and the Influence of Co, Pt and Cr Additions on the Saturation Magnetization of $\alpha''$-Fe16N2 Thin Films," Journal of Alloys and Compounds, vol. 479, Feb. 23, 2009, pp. 755-758.
Okamoto et al., "Characterization of Epitaxially Grown Fe—N Films by Sputter Beam Method," Journal of Applied Physics, vol. 79, No. 3, Feb. 1, 1996, pp. 1678-1683.
Sugita et al., "Magnetic and Mossbauer Studies of Single-Crystal Fe16N2 and Fe—N Martensite Films Epitaxially Grown by Molecular Beam Epitaxy (Invited)," Journal of Applied Physics, vol. 76, No. 10, Nov. 15, 1994, pp. 6637-6641.
Sugita et al., "Giant Magnetic Moment and Other Magnetic Properties of Epitaxially Grown Fe16N2 Single-Crystal Films (Invited)," Journal of Applied Physics, vol. 70, No. 10, Nov. 15, 1991, pp. 5977-5982.
Toops et al., "Pre-Oxidized and Nitrided Stainless Steel Alloy Foil for Proton Exchange Membrane Fuel Cell Bipolar Plates. Part 2: Single-Cell Fuel Evaluation of Stamped Plates," Journal of Power Sources, vol. 195, Mar. 19, 2010, pp. 5619-5627.
Klemmer et al., "Magnetic Hardening and Coercivity Mechanisms in L1 Ordered FePd Ferromagnets," Scripta Metallurgica et Materialia, vol. 33, Nos. 10-11, Dec. 1, 1995, pp. 1793-1805.
Ohtani et al., "Magnetic Properties of Mn—Al—C Permanent Magnet Alloys," IEEE Transactions on Magnetics, vol. MAG-13, No. 5, Sep. 1977, pp. 1328-1330.
Osaka et al., "A Soft Magnetic CoNiFe Film With High Saturation Magnetic Flux Density and Low Coercivity," Nature, vol. 392, Apr. 23, 1998, pp. 796-798.
Schrefl et al., "Exchange Hardening in Nano-Structured Two-Phase Permanent Magnets," Journal of Magnetism and Magnetic Materials, vol. 127, Jul. 12, 1993, pp. 273-277.
Kakeshita et al., "Effect of Magnetic Fields on Athermal and Isothermal Martensitic Transformations in Fe—Ni—Mn Alloys," Materials Transactions, vol. 34, No. 5, Dec. 9, 1992, pp. 415-422.
Koyano et al., "Magnetization of $\alpha'$ Iron Nitride Produced Through the fcc→bct Martensitic Transformation in High Magnetic Field," Journal of Applied Physics, vol. 100, No. 3, Aug. 1, 2006, 5 pp.
Oku et al., "Small-Angle Polarized Neutron Scattering Study of Spherical Fe16N2 Nano-Particles for Magnetic Recording Tape," Physica B, vol. 404, Sep. 1, 2009, pp. 2575-2577.
Shimoda et al., "High-Energy Cast Pr—Fe—B Magnets," Journal of Applied Physics, vol. 64, No. 10, Nov. 15, 1988, pp. 5290-5292.
Weber et al., "Search for Giant Magnetic Moments in Ion-Beam-Synthesized $\alpha''$-Fe16N2," Thin Solid Films, vol. 279, Nos. 1-2, Jun. 1996, pp. 216-220.
Watanabe et al., "A New Challenge: Grain Boundary Engineering for Advanced Materials by Magnetic Field Application," Journal of Materials Science, vol. 41, No. 23, Oct. 24, 2006 (online), pp. 7747-7759.
Takahashi et al., "Preparation of FeN Thin Films by Chemical Vapor Deposition Using a Chloride Source," Materials Letters, vol. 42, No. 6, Mar. 2000, pp. 380-382.
Stern et al., "Electronic and Structural Properties of Fe3Pd—Pt Ferromagnetic Shape Memory Alloys," Journal of Applied Physics, vol. 91, No. 10, May 15, 2002, pp. 7818-7820.
Qian et al., "NiZn Ferrite Thin Films Prepared by Facing Target Sputtering," IEEE Transactions Magnetics, vol. 33, No. 5, Sep. 1997, pp. 3748-3750.
Takahashi et al., "New Soft Magnetic Material of $\alpha'$-Fe—C With High Bs," Journal of Magnetism and Magnetic Materials, vol. 239, Nos. 1-3, Feb. 1, 2002, pp. 479-483.
Inoue et al., "Enhancement of the Formation of Fe16N2 on Fe Films by Co Additions (Invited)," Journal of Applied Physics, vol. 76, No. 10, Nov. 15, 1994, pp. 6653-6655.
Tsuchiya et al., "Spin Transition in Magnesiowüstite in Earth's Lower Mantle," Physical Review Letters, vol. 94, May 18, 2006, 4 pp.
Liu et al., "Nucleation Behavior of Bulk Ni—Cu Alloy and Pure Sb in High Magnetic Fields," Journal of Crystal Growth, vol. 321, Mar. 2, 2011, pp. 167-170.
Liu et al., "Effects of High Magnetic Fields on Solidification Microstructure of Al—Si Alloys," Journal of Material Science, vol. 46, Oct. 22, 2010, pp. 1628-1634.
Okunev et al., "The Low-Temperature Electric Conductivity of YBaCuO and LaSrMnO Dielectric Films Obtained by a Pulsed Laser Sputter Deposition Technique," Technical Physics Letters, vol. 26, No. 10, May 6, 2000, pp. 903-906.
Anisimov et al., "Density-Functional Calculation of Effective Coulomb Interactions in Metals," Physical Review B, vol. 43, No. 10, Apr. 1, 1991, pp. 7570-7574.
Anisimov et al., "Band-Structure Description of Mott Insulators (NiO, MnO, FeO, CoO)," Journal of Physics: Condensed Matter, vol. 2, No. 17, Apr. 30, 1990, pp. 3973-3987.
Anisimov et al., "First-Principles Calculations of the Electronic Structure and Spectra of Strongly Correlated Systems: the LDA+U Method," Journal of Physics: Condensed Matter, vol. 9, No. 4, Jan. 27, 1997, pp. 767-808.
Anisimov et al., "Band Theory and Mott Insulators: Hubbard U Instead of Stoner I," Physical Review B, vol. 44, No. 3, Jul. 15, 1991, pp. 943-954.

(56) References Cited

OTHER PUBLICATIONS

Campo et al., "Extended DFT + U + V Method With On-Site and Inter-Site Electronic Interactions," Journal of Physics: Condensed Matter, vol. 22, Jan. 19, 2010 (online), 12 pp.

Nimura et al., "Facing Targets Sputtering System for Depositing Co—Cr Perpendicular Magnetic Recording Media," Journal of Vacuum Science Technology, vol. 5, No. 1, Jan. 1987, pp. 109-110.

Lauter et al., "Highlights from the Magnetism Reflectometer at the SNS," Physica B, vol. 404, Sep. 1, 2009, pp. 2543-2546.

Godlevsky et al., "Soft Tetragonal Distortions in Ferromagnetic Ni2MnGa and Related Materials from First Principles," Physical Review B, vol. 63, Mar. 2, 2001, 5 pp.

Hou et al., "SmCo5/Fe Nanocomposites Synthesized from Reductive Annealing of Oxide Nanoparticles," Applied Physics Letters, vol. 91, Oct. 12, 2007, 3 pp.

Zhang et al., "Shift of the Eutectoid Point in the Fe—C Binary System by a High Magnetic Field," Journal of Physics D: Applied Physics, vol. 40, Oct. 19, 2007, pp. 6501-6506.

Pickett et al., "Reformulation of the LDA + U Method for a Local-Orbital Basis," Physical Review B, vol. 58, No. 3, Jul. 15, 1998, pp. 1201-1209.

Kohn et al., "Self-Consistent Equations Including Exchange and Correlation Effects," Physical Review, vol. 140, No. 4A, Nov. 15, 1965, pp. 1133-1138.

Gong et al., "Mechanically Alloyed Nanocomposite Magnets," Journal of Applied Physics, vol. 75, No. 10, May 15, 1994, pp. 6649-6651.

Li et al., "Effect of Assistant rf Field on Phase Composition of Iron Nitride Film Prepared by Magnetron Sputtering Process," Journal of Vacuum Science & Technology A, vol. 24, No. 1, Dec. 23, 2005 (online), pp. 170-173.

Liu et al., "Nanocrystalline Soft Magnetic Ribbon with $\alpha''$-Fe16N2 Nanocrystallites Embedded in Amorphous Matrix," Journal of Magnetism and Magnetic Materials, vol. 320, Jun. 10, 2008, pp. 2752-2754.

Wallace et al., "Enhanced Fe Moment in Nitrogen Martensite and Fe16N2 (Invited)," Journal of Applied Physics, vol. 76, No. 10, Nov. 15, 1994, pp. 6648-6652.

Wang et al., "Searching, Fabricating and Characterizing Magnetic Materials With Giant Saturation Magnetization," TMRC 2014, Aug. 11, 2014, 2 pp.

Wang et al., "Growth, Structural, and Magnetic Properties of Iron Nitride Thin Films Deposited by dc Magnetron Sputtering," Applied Surface Science, vol. 220, May 20, 2003, pp. 30-39.

Yamamoto et al., "Formation of Fe16N2 in Deformed Iron by Ion Implantation Method," Proceedings of 1998 International Conference on Ion Implantation Technology, Jun. 22-26, 1998, 4 pp.

Rui et al., "In-Cluster-Structured Exchange-Coupled Magnets with High Energy Densities," Applied Physics Letters, vol. 89, Sep. 19, 2006, 3 pp.

Bao et al., "Synthesis and Properties of $\alpha''$-Fe16N2 in Magnetic Particles," Journal of Applied Physics, vol. 75, No. 10, May 15, 1994, pp. 5870-5872.

Gao et al., "Exchange-coupling interaction and effective anisotropy in nanocomposite permanent materials," Chinese Science Bulletin, vol. 47, No. 14, Jul. 2002, 4 pp.

Grimsditch et al., "Exchange-spring systems: Coupling of hard and soft ferromagnets as measured by magnetization and Brillouin light scattering (Invited)," Journal of Applied Physics, vol. 85, No. 8, Apr. 15, 1999, 5 pp.

Stäblein, "Chapter 7: Hard Ferrites and Plastoferrites," Handbook of Ferromagnetic Materials, vol. 3, 1982, 162 pp. (Applicant points out, in accordance with MPEP 609.04(a), that the year of publication, 1982, is sufficiently earlier than the effective U.S. filing date, Aug. 5, 2015, so that the particular month of publication is not in issue.).

Coey et al., "The Magnetization of $\alpha''$-Fe16N2," Journal of Physics: Condensed Matter, vol. 6, 1994, pp. 23-28. Per MPEP 609.09(a), Applicant points out that the year of publication, 1994, is sufficiently earlier than the effective U.S. filing date, Aug. 5, 2015, and any foreign priority date so that the particular month of publication is not in issue.

Huang et al., "Synthesis and characterization of Fe16N2 in bulk form," Journal of Applied Physics, vol. 75, No. 10, May 15, 1994, 4 pp.

Tsubakino et al., "Formation of Fe16N2 in iron sheet by an ion implantation method," Materials Chemistry and Physics 54, Elsevier, Jul. 1998, pp. 301-304.

Tsubakino et al., "High resolution transmission electron microscopic study of the formation of Fe16N2 in bulk iron by ion implantation," Material Letters 26, Elsevier, Feb. 1996, pp. 155-159.

Grimsditch, et al., "Exchange-spring systems: Coupling of hard and soft ferromagnets as measured by magnetization and Brillouin light scattering (invited)," Journal of Applied Physics, vol. 85 No. 8, Apr. 15, 1999; pp. 5901-5904.

U.S. Appl. No. 15/129,439, by Wang et al., filed Sep. 27, 2016.
U.S. Appl. No. 62/107,733, by Wang et al., filed Jan. 26, 2015.
U.S. Appl. No. 62/107,748, by Wang et al., filed Jan. 26, 2015.
U.S. Appl. No. 15/501,607, by Wang et al., filed Aug. 5, 2015.
U.S. Appl. No. 62/107,700, by Wang et al., filed Jan. 26, 2015.
International Preliminary Report on Patentability from International Application No. PCT/US2015/043845, dated Feb. 23, 2017, 9 pp.

Turgut et al., "Thermal Plasma Synthesis of ?-FeN, Nanoparticles as Precursors for the Fe16N2 Synthesis by Annealing," ResearchGate, MRS Online Proceeding Library Jan. 2011, 7 pp.

\* cited by examiner

MULTILAYER IRON NITRIDE HARD MAGNETIC MATERIALS

CROSS-REFERENCE TO RELATED APPLICATIONS

This application is a national stage entry under 35 U.S.C. § 371 of International Application No. PCT/US2015/043845, filed Aug. 5, 2015, which claims the benefit of U.S. Provisional Patent Application No. 62/035,230, filed Aug. 8, 2014. The entire contents of International Application No. PCT/US2015/043845 and U.S. Provisional Patent Application No. 62/035,230 are incorporated herein by reference.

This invention was made with government support under DE-AR0000199 awarded by the United States Department of Energy. The government has certain rights in the invention.

TECHNICAL FIELD

The disclosure relates to hard magnetic materials and techniques for forming hard magnetic materials.

BACKGROUND

Permanent magnets, which are made from hard magnetic materials, play a role in many electromechanical systems, including, for example, alternative energy systems. For example, permanent magnets are used in electric motors or generators, which may be used in vehicles, wind turbines, and other alternative energy mechanisms. Many permanent magnets in current use include rare earth elements, such as neodymium, which result in high energy product. These rare earth elements are in relatively short supply, and may face increased prices and/or supply shortages in the future. Additionally, some permanent magnets that include rare earth elements are expensive to produce. For example, fabrication of NdFeB and ferrite magnets generally includes crushing material, compressing the material, and sintering at temperatures over 1000° C., all of which contribute to high manufacturing costs of the magnets. Additionally, the mining of rare earth can lead to severe environmental deterioration.

SUMMARY

The disclosure describes multilayer hard magnetic materials including $\alpha''$-$Fe_{16}N_2$ and techniques for forming multilayer hard magnetic materials including $\alpha''$-$Fe_{16}N_2$. For example, multilayer hard magnetic materials including $\alpha''$-$Fe_{16}N_2$ may be formed using chemical vapor deposition (CVD) or liquid phase epitaxy (LPE). Multilayer hard magnetic materials including $\alpha''$-$Fe_{16}N_2$ may provide an alternative to permanent magnets that include a rare earth element, as $Fe_{16}N_2$ has high saturation magnetization, high magnetic anisotropy constant, and high energy product. A multilayer hard magnetic material may include at least one layer including $\alpha''$-$Fe_{16}N_2$ and at least one layer including a soft magnetic material. In some examples, respective layers including $\alpha''$-$Fe_{16}N_2$ may be interleaved with respective layers including a soft magnetic material.

In some examples, the disclosure describes a method including heating an iron source to form a vapor comprising an iron-containing compound, and depositing iron from the vapor comprising the iron-containing compound and nitrogen from a vapor comprising a nitrogen-containing compound over a substrate to form a first layer comprising iron and nitrogen. Additionally, the method may include depositing iron from the vapor comprising the iron-containing compound, nitrogen from the vapor comprising nitrogen-containing compound, and at least one of carbon, boron, or oxygen from a vapor comprising the at least one of carbon, boron, or oxygen over the substrate to form a second layer comprising iron, nitrogen, and the at least one of carbon, boron, or oxygen. In some examples, the method further includes annealing the first layer to form at least some crystals comprising $\alpha''$-$Fe_{16}N_2$ and the second layer to form at least some crystals comprising $\alpha''$-$Fe_{16}(N_xZ_{1-x})_2$, wherein Z comprises the at least one of carbon, boron, or oxygen, and wherein x is a number greater than zero and less than one.

In some examples, the disclosure describes a method including heating an iron source to form a vapor comprising an iron-containing compound, and depositing iron from the vapor comprising the iron-containing compound and nitrogen from a vapor comprising a nitrogen-containing compound over a substrate to form a first layer comprising iron and nitrogen. Additionally, the method may include depositing iron from the vapor comprising the iron-containing compound, nitrogen from the vapor comprising nitrogen-containing compound, and at least one of carbon, boron, or oxygen from a vapor comprising the at least one of carbon, boron, or oxygen over the substrate to form a second layer comprising iron, nitrogen, and the at least one of carbon, boron, or oxygen. In some examples, the method further includes annealing the first layer to form at least some crystals comprising $\alpha''$-$Fe_{16}N_2$ and the second layer to form at least some crystals comprising $\alpha''$-$Fe_{16}N_2$ and at least some crystals comprising $\alpha''$-$Fe_{16}Z_2$, wherein Z comprises the at least one of carbon, boron, or oxygen.

In some examples, the disclosure describes a method including submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution; cooling the first coating solution to a second temperature to form a supersaturated first coating solution, wherein the second temperature is below the liquidus temperature of the iron-nitrogen mixture; and maintaining the substrate in the supersaturated first coating solution to allow a first layer comprising iron and nitrogen to form over the substrate. The method also may include submerging the substrate in a second coating solution comprising a nitrogen-containing solvent, an iron source, and a compound containing at least one of carbon, boron, or oxygen, wherein the second coating solution is saturated with the iron source at a third temperature above a liquidus temperature of a mixture to be deposited from the second coating solution; cooling the second coating solution to a fourth temperature to form a supersaturated second coating solution, wherein the fourth temperature is below the liquidus temperature of the mixture; and maintaining the substrate in the supersaturated second coating solution to allow a second layer comprising iron, nitrogen, and the at least one of carbon, boron, or oxygen to form over the substrate. In some examples, the method further includes annealing the first layer to form at least some crystals comprising $\alpha''$-$Fe_{16}N_2$ and the second layer to form at least some crystals comprising $\alpha''$-$Fe_{16}(N_xZ_{1-x})_2$, wherein Z comprises the at least one of carbon, boron, or oxygen, and wherein x is a number greater than zero and less than one.

In some examples, the disclosure describes a method including submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution; cooling the first coating solution to a second temperature to form a supersaturated first coating solution, wherein the second temperature is below the liquidus temperature of the iron-nitrogen mixture; and maintaining the substrate in the supersaturated first coating solution to allow a first layer comprising iron and nitrogen to form over the substrate. The method also may include submerging the substrate in a second coating solution comprising a nitrogen-containing solvent, an iron source, and a compound containing at least one of carbon, boron, or oxygen, wherein the second coating solution is saturated with the iron source at a third temperature above a liquidus temperature of a mixture to be deposited from the second coating solution; cooling the second coating solution to a fourth temperature to form a supersaturated second coating solution, wherein the fourth temperature is below the liquidus temperature of the mixture; and maintaining the substrate in the supersaturated second coating solution to allow a second layer comprising iron, nitrogen, and the at least one of carbon, boron, or oxygen to form over the substrate. In some examples, the method further includes annealing the first layer to form at least some crystals comprising $\alpha''$-$Fe_{16}N_2$ and the second layer to form at least some crystals comprising a mixture of $\alpha''$-$Fe_{16}N_2$ and $\alpha''$-$Fe_{16}Z_2$, wherein Z comprises the at least one of carbon, boron, or oxygen.

In some examples, the disclosure describes an article including a first set of layers, each layer of the first set of layers comprising $\alpha''$-$Fe_{16}N_2$; and a second set of layers, each layer of the second set of layers comprising a mixture of $\alpha''$-$Fe_{16}N_2$ and $\alpha''$-$Fe_{16}Z_2$, wherein Z comprises at least one of C, B, or O, wherein one or more respective layers of the first set of layers alternate with one or more respective layers of the second set of layers.

In some examples, the disclosure describes a first set of layers, each layer of the first set of layers comprising $\alpha''$-$Fe_{16}N_2$; and a second set of layers, each layer of the second set of layers comprising $\alpha''$-$Fe_{16}(N_xZ_{1-x})_2$, wherein Z comprises at least one of C, B, or O, wherein x is a number greater than zero and less than one, and wherein one or more respective layers of the first set of layers alternate with one or more respective layers of the second set of layers.

The details of one or more examples are set forth in the accompanying drawings and the description below. Other features, objects, and advantages will be apparent from the description and drawings, and from the claims.

BRIEF DESCRIPTION OF DRAWINGS

The summary, as well as the following detailed description, is further understood when read in conjunction with the appended drawings. For the purpose of illustrating the disclosure, there are shown in the drawings examples; however, the disclosure is not limited to the specific techniques, compositions, and devices disclosed. In addition, the drawings are not necessarily drawn to scale.

DETAILED DESCRIPTION

Figure 1:
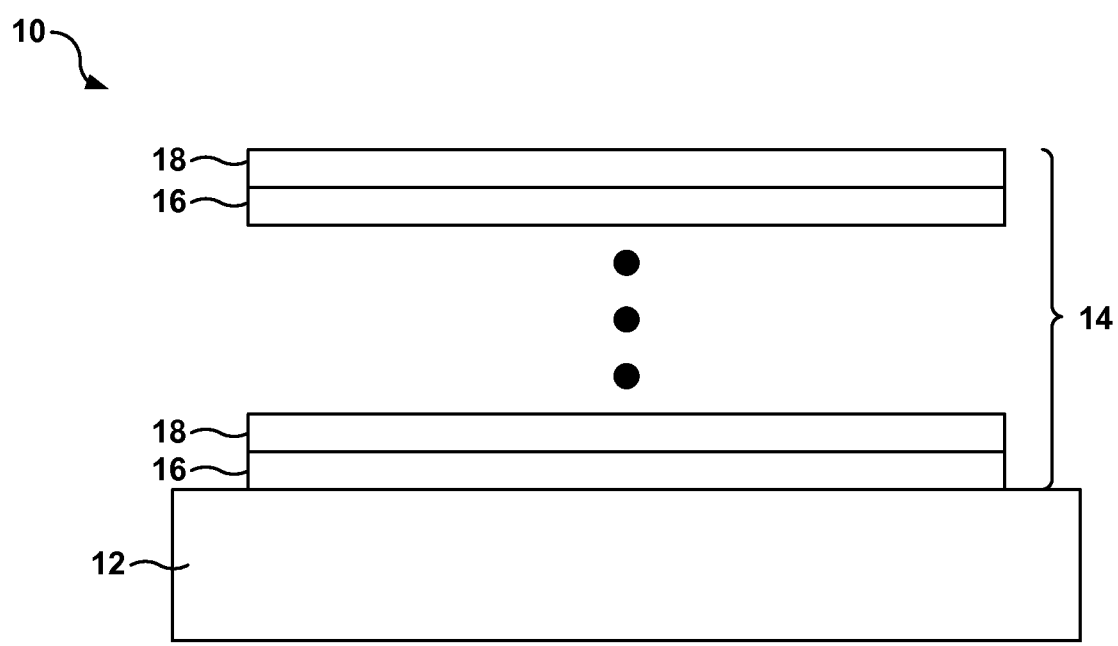
FIG. 1 is a conceptual and schematic diagram illustrating an example article including a substrate and a multilayer hard magnetic material including at least one layer including $\alpha''$-$Fe_{16}N_2$.

The present disclosure may be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular examples and is not intended to be limiting of the claims. When a range of values is expressed, another example includes from the one particular value and/or to the other particular value. Similarly, when values are expressed as approximations, by use of the antecedent "about," it will be understood that the particular value forms another example. All ranges are inclusive and combinable. Further, a reference to values stated in a range includes each and every value within that range. As used herein, use of the term "comprising" should also support other embodiments utilizing the terms "consisting of" and "consisting essentially of."

It is to be appreciated that certain features of the disclosure which are, for clarity, described herein in the context of separate examples, may also be provided in combination in a single example. Conversely, various features of the disclosure that are, for brevity, described in the context of a single example, may also be provided separately or in any subcombination.

The disclosure describes multilayer hard magnetic materials including at least one layer including $\alpha''$-$Fe_{16}N_2$ and techniques for forming the multilayer hard magnetic materials. Multilayer hard magnetic materials including at least one layer including $\alpha''$-$Fe_{16}N_2$ may provide an alternative to permanent magnets that include a rare earth element, as $Fe_{16}N_2$ has high saturation magnetization, high magnetic anisotropy constant, and high energy product.

The techniques for forming hard magnetic materials including at least one layer including $\alpha''$-$Fe_{16}N_2$ may include chemical vapor deposition (CVD) or liquid phase epitaxy (LPE). Either of these techniques may be used to deposit a thin film including at least one layer including $\alpha''$-$Fe_{16}N_2$ and at least one layer including a soft magnetic material on a substrate. In some examples, the substrate may include a semiconductor, such as silicon, GaAs, InGaAs, or the like. In other examples, the substrate may include another material, such as a glass; a high temperature polymer; SiC; MgO; SiO$_2$ (e.g., a layer of SiO$_2$ on a Si or other semiconductor substrate); a metal, such as Fe, Al, or Cu; or the like.

Multilayer hard magnetic materials including at least one layer including α"-Fe$_{16}$N$_2$ also include at least one other layer addition to the at least one layer including α"-Fe$_{16}$N$_2$. For example, the multilayer structure may include some layers including α"-Fe$_{16}$N$_2$ and some layers including a soft magnetic material. In some examples, the soft magnetic material may include α"-Fe$_{16}$(N$_x$Z$_{1-x}$)$_2$ (where x is a number greater than zero and less than one) or a mixture of α"-Fe$_{16}$N$_2$ and α"-Fe$_{16}$Z$_2$, where Z is at least one of boron (B), carbon (C), or oxygen (O). Another example of a soft magnetic material includes pure Fe. The one or more layers including α"-Fe$_{16}$N$_2$ may alternate with the one or more layers including the soft magnetic material. In some examples, each of the layers may be deposited using CVD or LPE. The layers including the soft magnetic material may be exchange coupled to the layers including α"-Fe$_{16}$N$_2$, such that the multilayer structure acts as a hard magnetic material.

CVD or LPE may allow incorporation of hard magnetic materials including α"-Fe$_{16}$N$_2$ into semiconductor devices and incorporation of forming of α"-Fe$_{16}$N$_2$ into semiconductor processes. For example, hard magnetic materials including α"-Fe$_{16}$N$_2$ may be incorporated into magnetic random access memory (MRAM), magnetic logic devices, magnetic storage devices, magnetic microelectromechanical systems (MEMS), micro motors, micro actuators, or the like.

In other examples, hard magnetic materials including α"-Fe$_{16}$N$_2$ and layers including a soft magnetic material may be incorporated into bulk magnetic materials, e.g., by consolidating a plurality of the layers. The bulk magnetic materials may be hard magnetic materials (e.g., permanent magnets), and may be utilized in articles such as electric motors, generators, magnetic sensors, actuators, components of automotive vehicles, components of wind turbines, or the like. In some examples, hard magnetic materials including α"-Fe$_{16}$N$_2$ and layers including a soft magnetic material may be incorporated into a workpiece, which may include a pellet, rod, thin film, nanoparticle, powder, or nanoscale powder.

FIG. 1 is a conceptual and schematic diagram illustrating an example article 10 including a substrate 12 and a multilayer hard magnetic material 14 including at least one layer including α"-Fe$_{16}$N$_2$. As shown in FIG. 1, multilayer hard magnetic material 14 includes a first set of layers 16 and a second set of layers 18. One or more respective layers from first set of layers 16 may alternate or be interleaved with one or more respective layers from second set of layers 18. Examples of article 10 include semiconductor devices, MRAM, magnetic logic devices, magnetic storage devices, magnetic MEMS, micro motors, micro actuators, micro sensors, or the like.

In some examples, layers from first set of layers 16 include α"-Fe$_{16}$N$_2$ and layers from second set of layers 18 include a soft magnetic material. In other examples, layers from first set of layers 16 include a soft magnetic material and layers from second set of layers 18 include α"-Fe$_{16}$N$_2$. In other words, a layer including α"-Fe$_{16}$N$_2$ may be nearest to substrate 12 or a layer including a soft magnetic material may be nearest to substrate 12. For the purposes of description only, first set of layers 16 is depicted in the following description as including α"-Fe$_{16}$N$_2$ and second set of layers 18 is depicted in the following description as including soft magnetic material.

Substrate 12 may include any material on which multilayer hard magnetic material 14 may be formed. In some examples, substrate 12 may include a semiconductor, such as silicon, GaAs, InGaAs, or the like. In other examples, the substrate may include another material, such as a glass; a high temperature polymer; SiC; MgO; SiO$_2$ (e.g., a layer of SiO$_2$ on a Si or other semiconductor substrate); a metal, such as Fe, Al, or Cu; or the like.

In some examples, substrate 12 may include a crystalline material with a different lattice structure, different lattice parameters, or both, than α"-Fe$_{16}$N$_2$, α"-Fe$_{16}$Z$_2$ (where Z includes at least one of C, B, or O), and/or α"-Fe$_{16}$(N$_x$Z$_{1-x}$)$_2$ (where x is a number greater than zero and less than one). In some examples, substrate 12 additionally or alternatively may have a different coefficient of thermal expansion (CTE) than α"-Fe$_{16}$N$_2$, α"-Fe$_{16}$Z$_2$, and/or α"-Fe$_{16}$(N$_x$Z$_{1-x}$)$_2$. In examples in which substrate 12 includes at least one of a different lattice structure, different lattice parameters, or a different CTE than α"-Fe$_{16}$N$_2$, α"-Fe$_{16}$Z$_2$, and/or α"-Fe$_{16}$(N$_x$Z$_{1-x}$)$_2$, substrate 12 may exert a strain on multilayer hard magnetic material 14 during an annealing technique, which may facilitate formation of α"-Fe$_{16}$N$_2$, α"-Fe$_{16}$Z$_2$, and/or α"-Fe$_{16}$(N$_x$Z$_{1-x}$)$_2$ in respective layers 16 and 18 of multilayer hard magnetic material 14.

Figure 2:
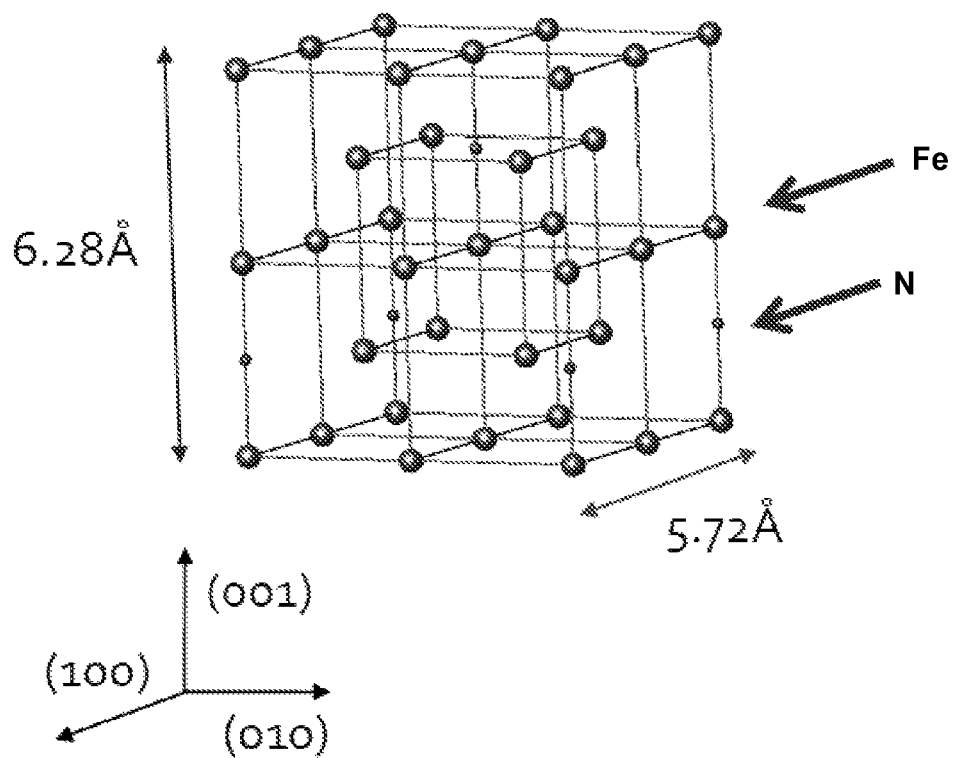
FIG. 2 is a conceptual diagram that shows an $\alpha''$-$Fe_{16}N_2$ unit cell.

The layers 16 that include α"-Fe$_{16}$N$_2$ may include hard magnetic material. α"-Fe$_{16}$N$_2$ has a body-centered tetragonal (bct) crystalline structure. In α"-Fe$_{16}$N$_2$, nitrogen atoms are ordered within the iron lattice. FIG. 2 is a conceptual diagram that shows an α"-Fe$_{16}$N$_2$ unit cell. As shown in FIG. 2, in the α"-Fe$_{16}$N$_2$ phase, the nitrogen atoms are aligned along the (002) (iron) crystal planes. Also shown in FIG. 2, the iron nitride unit cell is distorted such that the length of the α"-Fe$_{16}$N$_2$ unit cell along the <001> axis is approximately 6.28 angstroms (Å) while the length of the α"-Fe$_{16}$N$_2$ unit cell along the <010> and <100> axes is approximately 5.72 Å. The α"-Fe$_{16}$N$_2$ unit cell may be referred to as a bct unit cell when in the strained state. When the α"-Fe$_{16}$N$_2$ unit cell is in the strained state, the <001> axis may be referred to as the c-axis of the unit cell. The c-axis may be the magnetic easy axis of the α"-Fe$_{16}$N$_2$ unit cell. In other words, α"-Fe$_{16}$N$_2$ crystals exhibit magnetic anisotropy.

α"-Fe$_{16}$N$_2$ has high saturation magnetization and a high magnetic anisotropy constant. The high saturation magnetization and magnetic anisotropy constants result in a magnetic energy product that may be higher than rare earth magnets. For example, experimental evidence gathered from thin film α"-Fe$_{16}$N$_2$ permanent magnets suggests that bulk α"-Fe$_{16}$N$_2$ permanent magnets may have desirable magnetic properties, including an energy product of as high as about 134 MegaGauss*Oerstads (MGOe), which is about two times the energy product of NdFeB (which has an energy product of about 60 MGOe). Additionally, iron and nitrogen are abundant elements, and thus are relatively inexpensive and easy to procure. The high energy product of α"-Fe$_{16}$N$_2$ magnets may be useful in electric motors, electric generators, transformers, magnetic recording media, magnetic resonance imaging (MRI) magnets, magnetic sensors, magnetic actuators, components of automotive vehicles, and components of wind turbines, among other applications.

Figure 3:
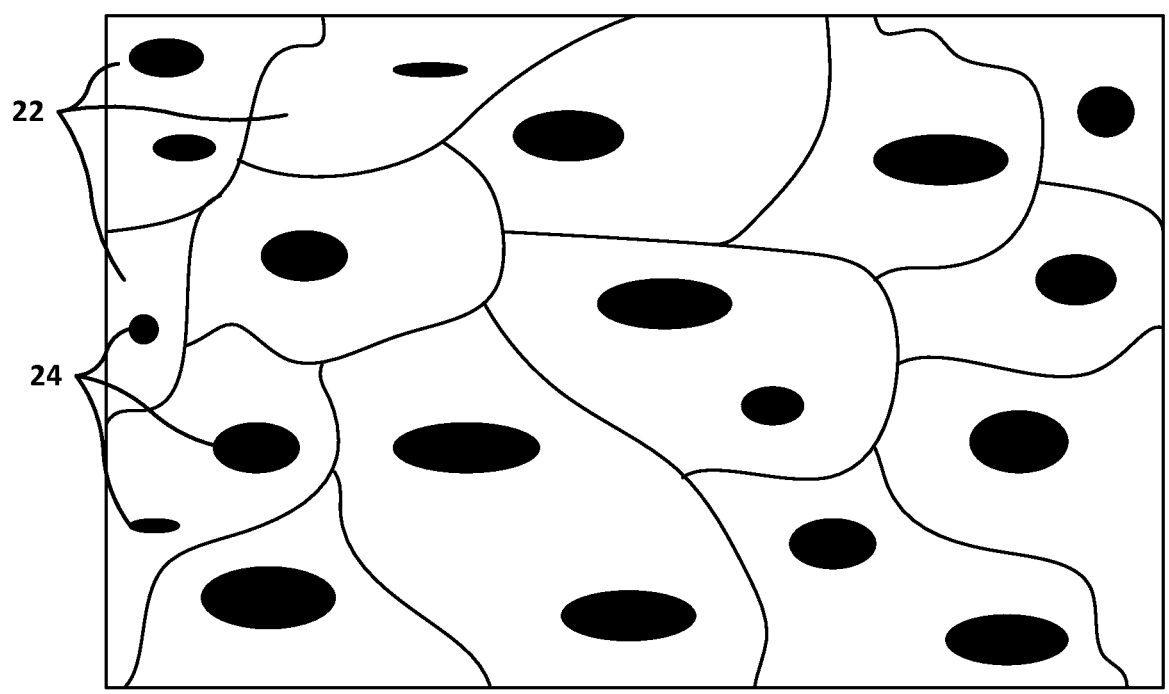
FIG. 3 is a conceptual diagram illustrating a material having iron or iron nitride (e.g., $Fe_8N$) domains and $\alpha''$-$Fe_{16}N_2$ domains.

However, α"-Fe$_{16}$N$_2$ may be difficult to produce, such that only part of each respective layer in first set of layers 16 includes α"-Fe$_{16}$N$_2$. FIG. 3 is a conceptual diagram illustrating a material having iron or iron nitride (e.g., Fe$_8$N) domains 22 and α"-Fe$_{16}$N$_2$ domains 24. In some examples, α"-Fe$_{16}$N$_2$ domains 24 in a respective layer in first set of layers 16 may be exchange-spring coupled to iron or iron nitride (e.g., Fe$_8$N) domains 22 within the respective layer. This may result in substantially the entire layer exhibiting the properties of α"-Fe$_{16}$N$_2$ domains 24, even though only part of the layer includes α"-Fe$_{16}$N$_2$ domains 24.

In some examples, respective layers from first set of layers 16 may be structured on a nanometer scale (e.g., the sizes of iron or iron nitride domains 22 and α"-Fe$_{16}$N$_2$ domains 24 are on the order of nanometers), magnetic coupling between the magnetically hard α"-Fe$_{16}$N$_2$ domains 24 and the magnetically soft iron or iron nitride domains 22 may occur substantially throughout each of the respective layers from first set of layers 16. In some examples, the size of the domains may be between about 5 nm and about 100 nm. Larger domain size may decrease coercivity of first set of layers 16. In some examples, such as when the magnetically soft material includes Fe or Fe$_8$N, the crystallographic texture of the α"-Fe$_{16}$N$_2$ domains 24 and the Fe or Fe$_8$N domains 22 may be coherent. In other words, there may be a lattice match between the domains 22 and 24. This may facilitate efficient exchange-spring coupling between the magnetically hard α"-Fe$_{16}$N$_2$ domains 24 and the magnetically soft Fe or Fe$_8$N domains 22, particularly across phase boundaries.

Exchange-spring coupling may effectively harden the magnetically soft material and provide magnetic properties for the bulk material similar to those of a layer fully formed of α"-Fe$_{16}$N$_2$. To achieve exchange-spring coupling throughout the volume of the magnetic material, the α"-Fe$_{16}$N$_2$ domains 24 may be distributed throughout respective layers from first set of layers 16, e.g., at a nanometer or micrometer scale. For example, the magnetically hard Fe$_{16}$N$_2$ domains 24 may constitute between about 5 vol. % and about 40 vol. % of the total volume of the layer of first set of layers 16, or between about 5 vol. % and about 20 vol. % of the total volume of the layer, or between about 10 vol. % and about 20 vol. % of the total volume of the layer, or between about 10 vol. % and about 15 vol. % of the total volume of the layer, or about 10 vol. % of the total volume of the layer, with the remainder of the volume being magnetically soft materials. The magnetically soft materials may include, for example, Fe, FeCo, Fe$_8$N, or combinations thereof.

In some examples, first set of layers 16 additionally may include at least one dopant, such as a ferromagnetic or nonmagnetic dopant and/or a phase stabilizer. In some examples, at least one ferromagnetic or nonmagnetic dopant may be referred to as a ferromagnetic or nonmagnetic impurity and/or the phase stabilizer may be referred to as a phase stabilization impurity. A ferromagnetic or nonmagnetic dopant may be used to increase at least one of the magnetic moment, magnetic coercivity, or thermal stability of the hard magnetic material formed from first set of layers 16. Examples of ferromagnetic or nonmagnetic dopants include Sc, Ti, V, Cr, Mn, Co, Ni, Cu, Zn, Zr, Nb, Mo, Ru, Rh, Pd, Ag, Cd, Pt, Au, Sm, C, Pb, W, Ga, Y, Mg, Hf, and Ta. For example, including Mn dopant atoms at levels between about 5 at. % and about 15 at. % in an iron nitride material including at least one Fe$_{16}$N$_2$ phase domain may improve thermal stability of the Fe$_{16}$N$_2$ phase domains and magnetic coercivity of the material compared to an iron nitride material not including Mn dopant atoms. In some examples, more than one (e.g., at least two) ferromagnetic or nonmagnetic dopants may be includes in the mixture including iron and nitrogen. In some examples, the ferromagnetic or nonmagnetic dopants may function as domain wall pinning sites, which may improve coercivity of the magnetic material formed from first set of layers 16. Table 1 includes example concentrations of ferromagnetic or nonmagnetic dopants within first set of layers 16.

TABLE 1

| Dopant | Concentration (at. %) |
|---|---|
| Sc | 0.1-33 |
| Ti | 0.1-28 |
| V | 0.1-25 |
| Nb | 0.1-27 |
| Cr | 0.1-10 |
| Mo | 0.1-3 |
| Mn | 0.1-28 |
| Ru | 2-28 |
| Co | 0.1-50 |
| Rh | 11-48 |
| Ni | 2-71 |
| Pd | 0.1-55 |
| Pt | 0.1-15 |
| Cu | 0.1-30 |
| Ag | 1-10 |
| Au | 1-10 |
| Zn | 0.1-30 |
| Cd | 0.1-35 |
| Zr | 0.1-33 |
| Pb | 0.1-60 |
| Mg | 0.1-60 |
| W | 0.1-20 |
| Ta | 0.1-20 |
| Ga | 0.1-10 |
| Sm | 0.1-11 |

Alternatively or additionally, first set of layers 16 may include at least one phase stabilizer. The at least one phase stabilizer may be an element selected to improve at least one of Fe$_{16}$N$_2$ volume ratio, thermal stability, coercivity, and erosion resistance. When present in first set of layers 16, the at least one phase stabilizer may be present in the mixture including iron and nitrogen at a concentration between about 0.1 at. % and about 15 at. %. In some examples in which at least two phase stabilizers at present in the mixture, the total concentration of the at least two phase stabilizers may be between about 0.1 at. % and about 15 at. %. The at least one phase stabilizer may include, for example, B, Al, C, Si, P, O, Co, Cr, Mn, and/or S. For example, including Mn dopant atoms at levels between about 5 at. % and about 15 at. % in an iron nitride material including at least one Fe$_{16}$N$_2$ phase domain may improve thermal stability of the Fe$_{16}$N$_2$ phase domains and magnetic coercivity of the iron nitride material compared to an iron nitride material not including Mn dopant atoms.

Layers of second set of layers 18 may include a magnetically soft material. For example, the magnetically soft material may include Fe, FeCo, Fe$_8$N, or the like. In some examples, the magnetically soft material may include α"-Fe$_{16}$(N$_x$Z$_{1-x}$)$_2$ or a mixture of α"-Fe$_{16}$N$_2$ and α"-Fe$_{16}$Z$_2$ (where Z includes at least one of C, B, or O).

As described above, α"-Fe$_{16}$N$_2$ is a hard magnetic material, having a magnetic easy axis lying along the c-axis. Calculations show that the magnetocrystalline anisotropy of α"-Fe$_{16}$N$_2$ may be about 1.6×10$^7$ erg/cm$^3$. α"-Fe$_{16}$N$_2$ also has a relatively high theoretical magnetic saturation moment of about 2.3 Bohr magnetons per Fe atom ($\mu_B$/Fe).

Similarly, α"-Fe$_{16}$Z$_2$ may be a hard magnetic material when the Z atoms are ordered within the iron crystal lattice. Similar to α"-Fe$_{16}$N$_2$, the Z atoms (C, B, or O) in ordered α"-Fe$_{16}$Z$_2$ may be positioned at interstitial sites within the iron crystal. For example, the Z atoms (C, B, or O) in ordered α"-Fe$_{16}$Z$_2$ may be positioned at the same sites as the N atoms depicted in FIG. 2. However, in ordered α"-Fe$_{16}$Z$_2$, the lattice parameters may be different than in α"-Fe$_{16}$N$_2$.

Further, ordered α"-Fe$_{16}$Z$_2$, such as when Z is carbon (C), may exhibit magnetocrystalline anisotropy with a magnetic easy axis lying in the a-b plane (e.g., [100]; perpendicular to the c-axis). Hence, the direction of magnetocrystalline anisotropy in α"-Fe$_{16}$C$_2$ may be substantially perpendicular to the direction of magnetocrystalline anisotropy in α"-Fe$_{16}$N$_2$. Calculations show that the magnetocrystalline anisotropy in ordered α"-Fe$_{16}$C$_2$ may be about −1.4×10$^7$ erg/cm$^3$. α"-Fe$_{16}$C$_2$ also has a relatively high theoretical magnetic saturation moment of about 2.1$\mu_B$/Fe.

Hence, when ordered α"-Fe$_{16}$C$_2$ is mixed in predetermined quantities with α"-Fe$_{16}$N$_2$ with c-axes of the respective α"-Fe$_{16}$C$_2$ and α"-Fe$_{16}$N$_2$ crystals oriented in substantially the same direction, the magnetocrystalline anisotropy may substantially cancel, leaving the material with a magnetocrystalline anisotropy value of near zero, while providing a theoretical magnetic saturation moment of about 2.2$\mu_B$/Fe (the average of the theoretical magnetic saturation moments of α"-Fe$_{16}$N$_2$ and α"-Fe$_{16}$C$_2$). For example, a magnetic material including a volume ratio of α"-Fe$_{16}$N$_2$ to α"-Fe$_{16}$C$_2$ of about 4.667:5.333 may have a coercivity of about 0 and a theoretical magnetic saturation moment of about 2.2$\mu_B$/Fe. In this way, a mixture of predetermined volumes of α"-Fe$_{16}$N$_2$ domains and α"-Fe$_{16}$C$_2$ domains may produce a soft magnetic material with a magnetocrystalline anisotropy value of near zero and a relatively high magnetic saturation moment. Similar results may be expected when B, O, or both are substituted for C, based on the similar atomic radii of C, B, and O.

Figure 4:
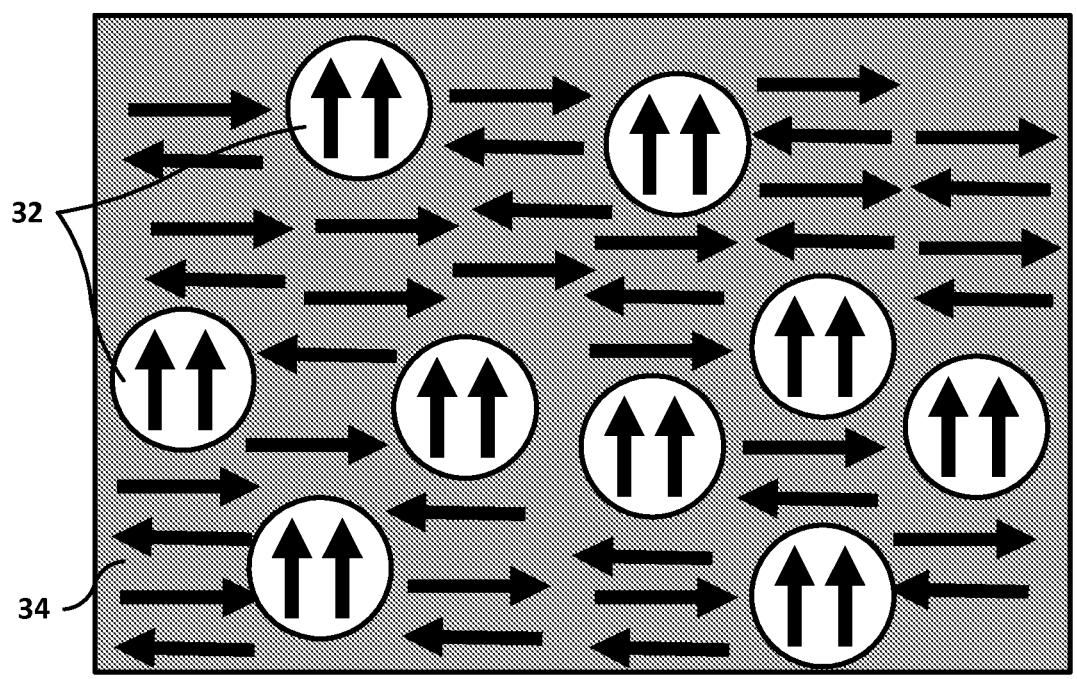
FIG. 4 is a conceptual diagram illustrating a soft magnetic material including domains of $\alpha''$-$Fe_{16}N_2$ and domains of $\alpha''$-$Fe_{16}Z_2$, where Z includes at least one of C, B, or O.

In some examples, the resulting material may be similar to that shown in FIG. 4. FIG. 4 is a conceptual diagram illustrating a soft magnetic material including domains of α"-Fe$_{16}$N$_2$ 32 and domains of α"-Fe$_{16}$Z$_2$ 34, where Z includes at least one of C, B, or O. In some examples, discrete domains of α"-Fe$_{16}$N$_2$ 32 may be present, along with discrete domains of α"-Fe$_{16}$Z$_2$ 34. The easy axes of the domains of α"-Fe$_{16}$N$_2$ 32 are illustrated as being oriented substantially vertically in FIG. 4, while the easy axes of the domains of α"-Fe$_{16}$Z$_2$ domains are illustrate as being oriented substantially horizontally in FIG. 4. When domains of α"-Fe$_{16}$N$_2$ 12 and domains of α"-Fe$_{16}$Z$_2$ 14 are present in predetermined volumes (e.g., about 4.667:5.333), this may lead the magnetocrystalline anisotropy of similar magnitudes and opposite signs to annihilate each other, leading to a material with high saturation magnetization and low magnetocrystalline anisotropy.

In other examples, rather than all of the respective domains of α"-Fe$_{16}$N$_2$ 32 having their magnetic easy axes lying in substantially the same direction, the respective easy axes of the respective domains of α"-Fe$_{16}$N$_2$ 32 may be substantially randomly distributed. Similarly, the respective easy axes of the respective domains of α"-Fe$_{16}$Z$_2$ 34 may be substantially randomly distributed. This also may lead to a material with high saturation magnetization and low magnetocrystalline anisotropy.

In some examples, rather than including discrete domains of α"-Fe$_{16}$N$_2$ and α"-Fe$_{16}$Z$_2$, a material may include one or more crystals of α"-Fe$_{16}$(N$_x$Z$_{1-x}$)$_2$, where Z includes at least one of C, B, or O, and x is a number greater than 0 and less than 1. In these examples, rather than forming discrete domains, the iron, nitrogen, and Z atoms form a crystalline structure in which some interstitial locations are filled by nitrogen atoms and some interstitial locations are filled by Z atoms. For example, FIG. 2 is a conceptual diagram illustrating an example α"-Fe$_{16}$N$_2$ unit cell. The unit cell in FIG. 2 illustrates five N atoms (1 N atom is fully in the unit cell, and 4 N atoms are partially in the unit cell). In α"-Fe$_{16}$(N$_x$Z$_{1-x}$)$_2$ at least some of the N atoms may be replaced with Z (at least one of C, B, or O) atoms. Although α"-Fe$_{16}$(N$_x$Z$_{1-x}$)$_2$ may not include some N atoms and some Z atoms in each unit cell (e.g., some unit cells may include only N atoms and some unit cells may include only Z atoms), when averaged over the volume of the soft magnetic material, the ratio of Fe to N to Z atoms may be expressed by the chemical formula Fe$_{16}$(N$_x$Z$_{1-x}$)$_2$.

Layers from second set of layers 18, which include the soft magnetic material, are interleaved with layers from first set of layers 16, which include α"-Fe$_{16}$N$_2$. The thicknesses of the layers from first set of layers 16 and the layers from second set of layers 18 may be selected such that layers from second set of layers 18 are magnetically exchange-spring coupled to layers from first set of layers 16. For example, each of layers 16 and layers 18 may define a thickness (perpendicular to the surface of substrate 12) that is less than about 50 nm. Exchange-spring coupling of layers from first set of layers 16 to adjacent layers from second set of layers 18 may result in substantially the entire volume of multilayer hard magnetic material 14 exhibiting properties similar to those of first set of layers 16, which include α"-Fe$_{16}$N$_2$.

Figure 5:
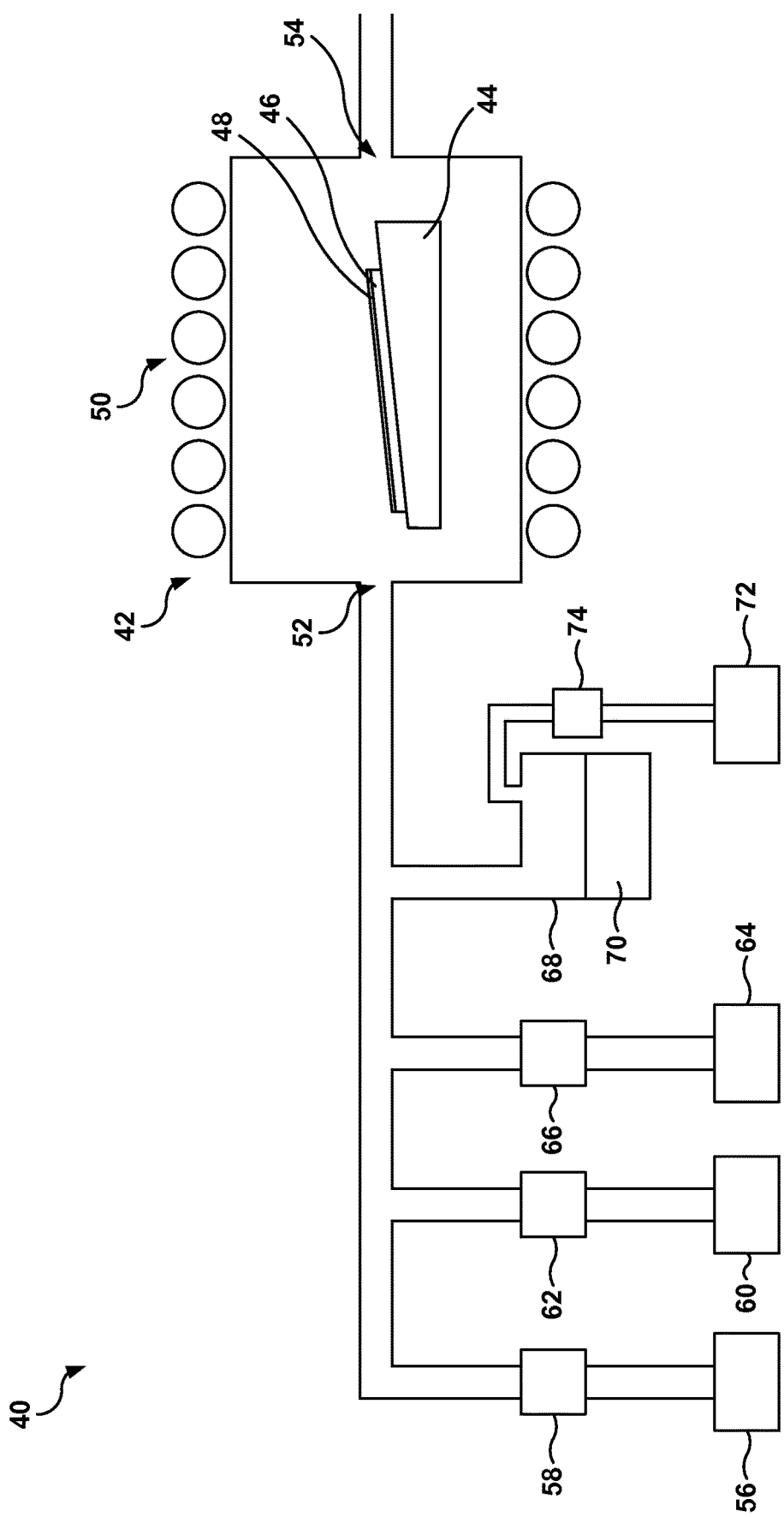
FIG. 5 is a conceptual and schematic diagram illustrating an example chemical vapor deposition system for forming a multilayer hard magnetic material including at least one layer including $\alpha''$-$Fe_{16}N_2$.

In some examples, multilayer hard magnetic material 14 may be formed using chemical vapor deposition (CVD) or liquid phase epitaxy (LPE). FIG. 5 is a conceptual and schematic diagram illustrating an example CVD system 40 for forming a multilayer coating 48. Multilayer coating 48 then may be annealed to form multilayer hard magnetic material 14 described with respect to FIG. 1.

System 40 includes a CVD chamber 42, which may enclose a susceptor 44. A substrate 46 is held by susceptor 44, and multilayer coating 48 is formed on at least a portion of substrate 46. CVD chamber 42 may include, for example, quartz or another refractory material. In some examples, CVD chamber 42 may be formed of a material that is substantially transparent to radio frequency (RF) magnetic energy.

In some examples, CVD chamber 42 is at least partially surrounded by RF induction coils 50. RF induction coils 50 may be electrically connected to an RF source (not shown in FIG. 5), which causes an alternating electrical current at RF to flow through RF induction coils 50. In some examples, the RF magnetic field generated by RF induction coils 50 may be absorbed by susceptor 44, which converts the RF energy to heat. This heats substrate 46. Hence, in some examples, susceptor 44 may include graphite or another material that absorbs RF energy of the frequency generated by RF induction coils 50.

In some examples, susceptor 44 may be shaped or oriented to position substrate 46 at an incline with respect to inlet 52. Positioning substrate 46 at an incline with respect to inlet 52 may reduce or substantially eliminate downstream depletion, which is a phenomena in which downstream portions of substrate 46 are coated with a thinner coating than upstream portions of substrate 46 due to depletion of reactants from the coating gas as the coating gas flows along a substantially horizontal substrate 46.

In some examples, rather than including a susceptor 44 heated by RF induction coils 50, CVD chamber 42 may be heated such that an entire volume of CVD chamber 42 is heated. For example, CVD chamber 42 may be disposed in a furnace, or CVD chamber 42 may be formed of a material that absorbs RF energy and heats the volume of CVD chamber 42.

Substrate 46 may include any material on which multilayer coating 48 may be formed, and may be an example of substrate 12 described with respect to FIG. 1. For example, substrate 46 may include a semiconductor, such as silicon, GaAs, InGaAs, or the like. In other examples, the substrate may include another material, such as a glass, a high temperature polymer, SiC, MgO, $SiO_2$ (e.g., a layer of $SiO_2$ on a Si or other semiconductor substrate), or the like.

In some examples, substrate 46 may include a crystalline material with a different lattice structure, different lattice parameters, or both, than at least one of $\alpha''\text{-}Fe_{16}N_2$, $\alpha''\text{-}Fe_{16}Z_2$, or $\alpha''\text{-}Fe_{16}(N_xZ_{1-x})_2$, where Z includes at least one of C, B, or O. In some examples, substrate 46 additionally or alternatively may have a different coefficient of thermal expansion (CTE) than at least one of $\alpha''\text{-}Fe_{16}N_2$, $\alpha''\text{-}Fe_{16}Z_2$, or $\alpha''\text{-}Fe_{16}(N_xZ_{1-x})_2$. In examples in which substrate 46 includes at least one of a different lattice structure, different lattice parameters, or a different CTE than at least one of $\alpha''\text{-}Fe_{16}N_2$, $\alpha''\text{-}Fe_{16}Z_2$, or $\alpha''\text{-}Fe_{16}(N_xZ_{1-x})_2$, substrate 46 may exert a strain on coating 48 during an annealing technique, which may facilitate formation of at least one of $\alpha''\text{-}Fe_{16}N_2$, $\alpha''\text{-}Fe_{16}Z_2$, or $\alpha''\text{-}Fe_{16}(N_xZ_{1-x})_2$ in coating 48.

CVD chamber 42 may include an inlet 52 and an outlet 54. Inlet 52 may be fluidically connected to one or more sources of coating gases. For example, in system 40, inlet 52 is fluidically connected to a carrier gas source 56, a first source 60 of a coating constituent, and a second source 64 of a coating constituent, and a third source 68 of a coating constituent.

In some examples, carrier gas source 56 may include a gas that carries the coating gas to the interior of CVD chamber 12. In some examples, carrier gas source 56 may include a source of substantially inert gas (e.g., a gas that is substantially non-reactive with other elements and compounds present in system 40 during operation of system 40). A substantially inert gas may include, for example, a noble gas, such as argon.

In some examples, carrier gas source 56 additionally or alternatively may include a gas that may react with one or more elements and compounds present in system 40. For examples, carrier gas source 56 may include a source of hydrogen gas ($H_2$). In some examples, hydrogen gas may react with an iron precursor to liberate iron. In some instances, carrier gas source 56 may include a mixture of a substantially inert gas and a gas that reacts with one or more elements and compounds present in system 40. For example, carrier gas source 56 may include a mixture of hydrogen gas and argon.

Carrier gas source 56 may be fluidically connected to CVD chamber 42 via conduit or piping, and at least one valve 58. Valve 58 may be used to control flow of carrier gas from carrier gas source 56 to CVD chamber 42.

System 40 also includes first source 60. First source 60 may include a source of a vapor including a nitrogen-containing compound. In some examples, first source 60 may include a gaseous source of a nitrogen precursor, such as gaseous ammonia ($NH_3$). In other examples, first source 60 may include a liquid or solid source of a nitrogen precursor, such as ammonium nitrate ($NH_4NO_3$; solid), an amide (liquid or solid), or hydrazine (liquid).

Amides include a C—N—H bond and hydrazine includes an N—N bond Ammonium nitrate, amides and hydrazine may serve as a nitrogen donor for forming the material including iron nitride. Example amides include carbamide (($NH_2)_2CO$; also referred to as urea), methanamide (Formula 1), benzamide (Formula 2), and acetamide (Formula 3), although any amide may be used.

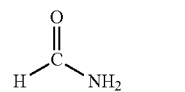

Formula 1

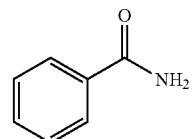

Formula 2

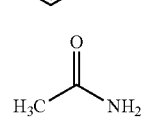

Formula 3

In some examples, amides may be derived from carboxylic acids by replacing the hydroxyl group of a carboxylic acid with an amine group. Amides of this type may be referred to as acid amides.

In examples in which the nitrogen-containing compound in first source 60 is a solid or liquid, first source 60 may include a heat source to vaporize the nitrogen-containing compound and form a vapor including a nitrogen-containing compound.

First source 60 may be fluidically connected to CVD chamber 42 via conduit or piping, and at least one valve 62. Valve 62 may be used to control flow of nitrogen-containing vapor from first source 60 to CVD chamber 42.

System 40 also includes second source 64. Second source 64 may include a source of a vapor including a Z atom-containing compound, where Z includes at least one of carbon, boron, or oxygen. For the purposes of description only, FIGS. 5 and 6 will be described with second source 64 being a source of a carbon-containing compound. However, it will be appreciated that similar principles may be applied to sources of a boron-containing material, sources of an oxygen containing material, or both.

In some examples, second source 64 may include a gaseous source of a carbon-containing compound, such as gaseous carbon monoxide (CO), gaseous carbon dioxide ($CO_2$), or gaseous methane ($CH_4$). In other examples, second source 64 may include a liquid or solid source of a carbon-containing compound, such as pure carbon (e.g., graphite) or urea. In examples in which the carbon-containing compound in second source 64 is a solid or liquid, second source 64 may include a heat source to vaporize the carbon-containing compound and form a vapor including a carbon-containing compound.

Second source 64 may be fluidically connected to CVD chamber 42 via conduit or piping, and at least one valve 66. Valve 66 may be used to control flow of carbon-containing vapor from second source 64 to CVD chamber 42.

In some examples, such as when urea is used both for the carbon source and the nitrogen source, system 40 may not include separate first and second sources 60 and 64 for the nitrogen-containing compound and the carbon-containing compound, but may instead include a single source for both the nitrogen-containing compound and the carbon-containing compound.

System 40 also includes third source 68. Third source 68 may include a source of iron or an iron precursor (or donor). In the example shown in FIG. 5, third source 68 contains a liquid iron donor 70, such as $FeCl_3$ or $Fe(CO)_5$. Third source 68 is fluidically coupled to a gas source 72 via valve 74, which controls flow of gas from gas source 72 into third source 68. In some examples, gas source 72 may be a source of hydrogen ($H_2$) has or another reducing gas.

Gas from gas source 72 flows into third source 68 and vaporizes at least some of liquid iron donor 70. Gas from gas source 72 then carrier the vapor including the iron-containing compound into CVD chamber 42 through inlet 52.

Valves 58, 62, 66, and 74 may be used to control the total flow rate of gases and vapors into CVD chamber 42, and the relative proportion of carrier gas, the vapor including the nitrogen-containing compound, the vapor including the carbon-containing compound, and the vapor including the iron-containing compound in the gases and vapors flowing into CVD chamber 42. For example, valves 58, 62, 66, and 74 may be controlled to allow deposition of alternating layers from first set of layers 16 and second set of layers 18 to produce multilayer hard magnetic material 14 shown in FIG. 1. To form a layer from first set of layers 16, which includes $\alpha''$-$Fe_{16}N_2$, valves 58, 62, 66, and 74 may be controlled to allow the carrier gas, the vapor including the nitrogen-containing compound, and the vapor including the iron-containing compound to flow into CVD chamber 42, while preventing the vapor including the carbon-containing compound from flowing into CVD chamber 42. In some examples, to form a layer from first set of layers 16, valves 58, 62, 66, and 74 may be controlled to allow the carrier gas, the vapor including the nitrogen-containing compound, and the vapor including the iron-containing compound to flow into CVD chamber 42 to produce an atomic ratio of iron to nitrogen in the gases and vapors flowing into CVD chamber 42 to be between about 11.5:1 (iron:nitrogen) and about 5.65:1 (iron:nitrogen). For example, the atomic ratio between iron and nitrogen atoms in the of the gases and vapors flowing into CVD chamber 12 may be about 9:1 (iron:nitrogen), about 8:1 (iron:nitrogen), or about 6.65:1 (iron:nitrogen).

In some examples, to form a layer from first set of layers 16, the flow rate of the carrier gas may be between about 5 standard $cm^3$/minute (sccm) and about 5,000 sccm, the flow rate of the vapor including the nitrogen-containing compound may be between about 10 sccm and about 1,000 sccm, and the flow rate of the vapor including the iron-containing compound may be between about 100 sccm and about 5,000 sccm. Flow rates such as these may result in a growth rate of a layer from first set of layers 16 of between about 100 micrometers per hour ($\mu$m/h) and about 1,000 $\mu$m/h.

In some examples, substrate 46 may be heated by susceptor 44 and RF induction coils 50 above a decomposition temperature of the iron-containing compound, the decomposition temperature of the nitrogen-containing compound, or both. For example, substrate 46 may be heated to a temperature between about 200° C. and about 1,000° C. by susceptor 44 and RF induction coils 50.

In some examples in which substantially only susceptor 44 and substrate 46 are heated, the iron-containing compound and the nitrogen-containing compound may decompose to release iron and nitrogen, or may react with each other to form an iron nitride compound. Because substrate 46 is heated, this reaction or these reactions may occur at the surface of substrate 46, resulting in a layer from first set of layers 16 being formed and including iron and nitrogen.

In examples in which substantially the entire volume of CVD chamber 42 is heated (e.g., by a furnace), the decomposition reactions or reaction between the iron-containing compound and the nitrogen-containing compound may occur above substrate within the volume of CVD chamber 42. The liberated iron and nitrogen atoms or iron nitride compound then may deposit over the surface of substrate 46 in the layer from first set of layers 16.

In some examples, a reaction between the iron-containing compound and the nitrogen containing compound may include:

$16FeCl_3 + 2NH_3 + 21H_2 \rightarrow 2Fe_8N + 48HCl$

As described above, the ratio of iron to nitrogen in the gases and vapors entering CVD chamber 42 during formation of a layer from first set of layers 16 may be between about 11.5:1 (iron:nitrogen) and about 5.65:1 (iron:nitrogen), such as about 8:1 (iron:nitrogen). The layer from first set of layers 16 may include approximately the same ratio of iron to nitrogen in the gases and vapors entering CVD chamber 42. Thus, the layer from first set of layers 16 may include an iron to nitrogen ratio of between about 11.5:1 (iron:nitrogen) and about 5.65:1 (iron:nitrogen), such as about 9:1 (iron:nitrogen), about 8:1 (iron:nitrogen), or about 6.65:1 (iron:nitrogen).

In some examples, the layer from first set of layers 16, as deposited, may include at least one type of iron nitride, such as, for example, FeN, $Fe_2N$ (e.g., $\zeta$-$Fe_2N$), $Fe_3N$ (e.g., $\epsilon$-$Fe_3N$), $Fe_4N$ (e.g., $\gamma'$-$Fe_4N$, $\gamma$-$Fe_4N$, or both), $Fe_2N_6$, $Fe_8N$, $\alpha''$-$Fe_{16}N_2$, or FeN (where x is between about 0.05 and about 0.5), in addition to iron and/or nitrogen. In some examples, the layer from first set of layers 16 may have a purity (e.g., collective iron and nitrogen content) of at least 92 atomic percent (at. %).

The layer from first set of layers 16 may include any selected thickness, and the thickness may at least partially depend on the CVD parameters, including the time for which the CVD technique is carried out. In some examples, the selected thickness of the layer from first set of layers 16 may be based on a thickness that allows exchange-spring coupling of layers from second set of layers 18 to layers from first set of layers 16. For example, the thickness of the layer from first set of layers 16 may be less than about 50 nm.

In some examples, to form a layer from second set of layers 18, which includes a soft magnetic material, valves 58, 62, 66, and 74 may be controlled to allow the carrier gas and the vapor including the iron-containing compound to flow into CVD chamber 42, while preventing the vapors including the nitrogen-containing compound and the carbon-containing compound from flowing into CVD chamber 42. This may result in a layer including substantially pure iron being deposited.

In other examples, to form a layer from second set of layers 18, valves 58, 62, 66, and 74 may be controlled to allow the carrier gas, the vapor including the nitrogen-containing compound, the vapor including the carbon-containing compound, and the vapor including the iron-containing compound to flow into CVD chamber 42 to produce an atomic ratio of iron to the combination nitrogen and carbon in the gases and vapors flowing into CVD chamber 42 to be between about 11.5:1 (iron:nitrogen+carbon) and about 5.65:1 (iron:nitrogen+carbon). For example, the atomic ratio of iron to the combination of nitrogen and carbon in the gases and vapors flowing into CVD chamber 42 may be about 9:1 (iron:nitrogen+carbon), about 8:1 (iron:nitrogen+carbon), or about 6.65:1 (iron:nitrogen+carbon).

Additionally, valves 62 and 66 may be controlled to control the relative flow rates of the vapor including the nitrogen-containing compound and the vapor including the carbon-containing compound to produce a predetermined atomic ratio of nitrogen to carbon in the gases flowing into CVD chamber 42. For example, valves 62 and 66 may be controlled to control the relative flow rates of the vapor including the nitrogen-containing compound and the vapor including the carbon-containing compound to produce an atomic ratio of nitrogen to carbon of between about 0.1:1 and about 10:1, such as about 1:1 or about 4.667:5.333.

In some examples, to form a layer from second set of layers 18, the flow rate of the carrier gas may be between about 5 sccm and about 5,000 sccm, the flow rate of the vapor including the nitrogen-containing compound may be between about 10 sccm and about 1,000 sccm, the flow rate of the vapor including the carbon-containing compound may be between about 0.1 sccm and about 1,000 sccm, and the flow rate of the vapor including the iron-containing compound may be between about 100 sccm and about 5,000 sccm. Flow rates such as these may result in a growth rate of a layer from second set of layers 18 of between about 100 µm/h and about 1,000 µm/h.

In some examples, substrate 46 may be heated by susceptor 44 and RF induction coils 50 above at least one of a decomposition temperature of the iron-containing compound, the decomposition temperature of the nitrogen-containing compound, or a decomposition temperature of the carbon-containing compound. For example, substrate 46 may be heated to a temperature between about 200° C. and about 1,000° C. by susceptor 44 and RF induction coils 50.

In some examples in which substantially only susceptor 44 and substrate 46 is heated, the iron-containing compound, the nitrogen-containing compound, and the carbon-containing compound may decompose to release iron, nitrogen, and carbon, or may react with each other to form an iron-nitrogen-carbon compound. Because substrate 46 is heated, this reaction or reactions may occur at the surface of substrate 46, resulting in a layer from second set of layers 18 being formed and including iron, nitrogen, and carbon.

In examples in which substantially the entire volume of CVD chamber 42 is heated (e.g., by a furnace), the decomposition reactions or reaction between the iron-containing compound, the nitrogen-containing compound, and the carbon-containing compound may occur above substrate within the volume of CVD chamber 42. The liberated iron, nitrogen, and carbon atoms or iron-carbide-nitride compound then may deposit over the surface of substrate 46 in the layer from second set of layers 18.

As used herein, depositing or forming "over" the substrate includes both depositing or forming a layer directly on the surface of the substrate, as well as depositing a layer one another layer. The other layer may be directly on the surface of the substrate, or on yet another layer that is on or over the substrate. For example, FIG. 5 has been described as forming a layer of first set of layers 16 over substrate 46 and a layer of second set of layers 18 over substrate 46. This means that the layer of first set of layers 16 may be formed directly on substrate 46, may be formed on a layer of second set of layers 18, or may be formed on another layer. Similarly, this means that the layer of second set of layers 18 may be formed directly on substrate 46, may be formed on a layer of first set of layer 16, or may be formed on another layer. Depositing or forming "on" means that the layer is formed directly on the underlying layer, with no layers in between.

In some examples, a reaction between the iron-containing compound, the nitrogen containing compound, and the carbon-containing compound may include:

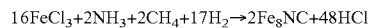

As described above, the ratio of iron to nitrogen plus carbon in the gases and vapors entering CVD chamber 42 during formation of a layer from second set of layers 18 may be between about 11.5:1 (iron:(nitrogen+carbon)) and about 5.65:1 (iron:(nitrogen+carbon)), such as about 8:1 (iron:(nitrogen+carbon)). The layer from second set of layers 18 may include approximately the same ratio of iron to nitrogen in the gases and vapors entering CVD chamber 42. Thus, the layer from second set of layers 18 may include an iron to nitrogen plus carbon ratio of between about 11.5:1 (iron:(nitrogen+carbon)) and about 5.65:1 (iron:(nitrogen+carbon)), such as about 9:1 (iron:(nitrogen+carbon)), about 8:1 (iron:(nitrogen+carbon)), or about 6.65:1 (iron:(nitrogen+carbon)).

The layer from second set of layers 18 may include any selected thickness, and the thickness may at least partially depend on the CVD parameters, including the time for which the CVD technique is carried out. In some examples, the selected thickness of the layer from second set of layers 18 may be based on a thickness that allows exchange-spring coupling of layers from second set of layers 18 to layers from first set of layers 16. For example, the thickness of the layer from second set of layers 18 may be less than about 50 nm.

Valves 58, 62, 66, and 74 may be controlled such that a layer from first set of layers 16 and a layer from second set of layers 18 are alternately deposited, resulting in formation of a structure similar to or substantially the same as multilayer hard magnetic material 14 illustrated in FIG. 1. The number of layers from first set of layers 16 and layers from second set of layers 18 may be selected based on the desired final structure of multilayer hard magnetic material 14, which may be formed from multilayer coating 48.

In some examples, portions of substrate 46 may be masked, leaving only portions of substrate 46 exposed on which coating 48 is formed. In other examples, portions of multilayer coating 48 may be etched after deposition of multilayer coating 48 to remove the portions of multilayer coating 48, leaving only portions of substrate 46 coated with multilayer coating 48. In this way, multilayer coating 48 may be controllably formed on only selected portions of substrate 46 and later converted to multilayer hard magnetic material 14.

Once multilayer coating 48 has been formed to a predetermined thickness, substrate 16 and coating 18 may be removed from CVD chamber 12 and subjected to an annealing technique. The annealing technique may facilitate multilayer hard magnetic material 14.

The annealing technique may be carried out at a temperature that produces strain in at least one layer of multilayer coating 48 due to differences in the coefficients of thermal expansion for substrate 46 and multilayer coating 48 to access at least one of the $\alpha''\text{-Fe}_{16}N_2$, the $\alpha''\text{-Fe}_{16}Z_2$ phase, or the $\alpha''\text{-Fe}_{16}(N_xZ_{1-x})_2$ phase (where Z includes at least one of C, B, or O). Additionally, the annealing technique allows diffusion of N+ions, Z+ions, or both within iron crystals in respective layers of multilayer coating 48 to form $\alpha''\text{-Fe}_{16}N_2$, $\alpha''\text{-Fe}_{16}Z_2$, or $\alpha''\text{-Fe}_{16}(N_xZ_{1-x})_2$. In some examples, annealing at relatively low temperatures allows transformation of partial $Fe_8N$ disordered phase into $\alpha''\text{-Fe}_{16}N_2$ ordered phase. Similarly, annealing at relatively low temperatures is expected to allow transformation of partial $Fe_8Z$ disordered phase into $\alpha''\text{-Fe}_{16}Z_2$ ordered phase and partial $Fe_8(N_xZ_{1-x})$ disordered phase into $\alpha''\text{-Fe}_{16}(N_xZ_{1-x})_2$ ordered phase.

In some examples, the strain during annealing may elongate the shape of at least some grain domains in multilayer coating 48 (e.g., at least some α"-Fe$_{16}$N$_2$ domains in at least some layers of first set of layers 16). Grain elongation may contribute to magnetic anisotropy of layers in first set of layers 16. Additionally, in some examples, the dimensions and shape of the layers in first set of layers 16 may contribute to shape anisotropy, which may further contribute to magnetic anisotropy of layers in first set of layers 16.

In some examples, the annealing technique may be carried out at a temperature below about 300° C., such as between about 120° C. and about 300° C., between about 120° C. and about 220° C., or between about 150° C. and about 220° C. The annealing technique may be performed in a nitrogen (N$_2$) or argon (Ar) atmosphere, or in a vacuum or near-vacuum.

The temperature and duration of the annealing step may be selected based on, for example, a size of the sample and diffusion coefficients of nitrogen atoms in iron and Z atoms in iron at the annealing temperature. Based on these factors, the temperature and duration may be selected to provide sufficient time for nitrogen atoms and Z atoms to diffuse to locations within respective layers of multilayer coating 48 to form Fe$_{16}$N$_2$ domains, α"-Fe$_{16}$Z$_2$ domains, and/or α"-Fe$_{16}$(N$_x$Z$_{1-x}$)$_2$ domains.

Additionally, the temperature and duration of the annealing technique may be selected based on a desired volume fraction of the respective phase domains in respective layers of multilayer coating 48. For example, at a selected temperature, a longer annealing technique may result in a higher volume fraction of α"-Fe$_{16}$N$_2$. Similarly, for a given annealing technique duration, a higher temperature may result in a higher volume fraction of α"-Fe$_{16}$N$_2$. However, for durations above a threshold value, the additional volume fraction of α"-Fe$_{16}$N$_2$ may be limited or eliminated, as the volume fraction of α"-Fe$_{16}$N$_2$ reaches a relatively stable value. For example, at a temperature of about 150° C., after about 20 hours, the volume fraction of α"-Fe$_{16}$N$_2$ reaches a stable value. The duration of the annealing step may be at least about 5 hours, such as at least about 20 hours, or between about 5 hours and about 100 hours, or between about 5 hours and about 80 hours or between about 20 hours and about 80 hours, or about 40 hours.

Fe$_8$N and α"-Fe$_{16}$N$_2$ have similar body-centered tetragonal (bct) crystalline structure. However, in α"-Fe$_{16}$N$_2$, nitrogen atoms are ordered within the iron lattice, while in Fe$_8$N, nitrogen atoms are randomly distributed within the iron lattice.

The annealing technique facilitates formation of the bct α"-Fe$_{16}$N$_2$ phase crystalline structure at least in part due to the strain exerted on the iron crystal lattice as a result of differential expansion of substrate 46 and multilayer coating 48 during the annealing step. For example, the coefficient of thermal expansion for iron is 11.8 μm/m·K, while for silicon it is 2.6 μm/m·K. This difference in thermal expansion coefficients results in a compression stress substantially parallel the major plane of a layer of first layers 16 in multilayer coating 48 and a corresponding stretching force being generated along the <001> crystalline direction on a layer of first layers 16 in a multilayer coating 48 with an (110) face. In some examples, the strain on a layer of first layers 16 in multilayer coating 48 may be between about 0.3% and about 7%, which may result in a substantially similar strain on individual crystals of the iron nitride, such that the unit cell is elongated along the <001> axis between about 0.3% and about 7%. This may facilitate incorporation of nitrogen atoms at the preferred positions of the α"-Fe$_{16}$N$_2$ crystal.

In some examples, rather than transforming all of first layers 16 in multilayer coating 48 to α"-Fe$_{16}$N$_2$ phase, the annealing technique may result in formation of α"-Fe$_{16}$N$_2$ phase domains within domains of Fe, Fe$_8$N, and/or other iron nitride compositions. For example, the resulting structure may be similar to the structure illustrated in and described with respect to FIG. 3.

Similarly, carbon atoms in α"-Fe$_{16}$C$_2$ and nitrogen and carbon atoms in α"-Fe$_{16}$(N$_x$C$_{1-x}$)$_2$ may be aligned along the (002) (iron) crystal planes. The annealing technique facilitates formation of the bct α"-Fe$_{16}$C$_2$ phase crystalline structure or α"-Fe$_{16}$(N$_x$C$_{1-x}$)$_2$ in layers of second set of layers 18 at least in part due to the strain exerted on the iron crystal lattice as a result of differential expansion of substrate 46 and multilayer coating 48 during the annealing step.

Figure 6:
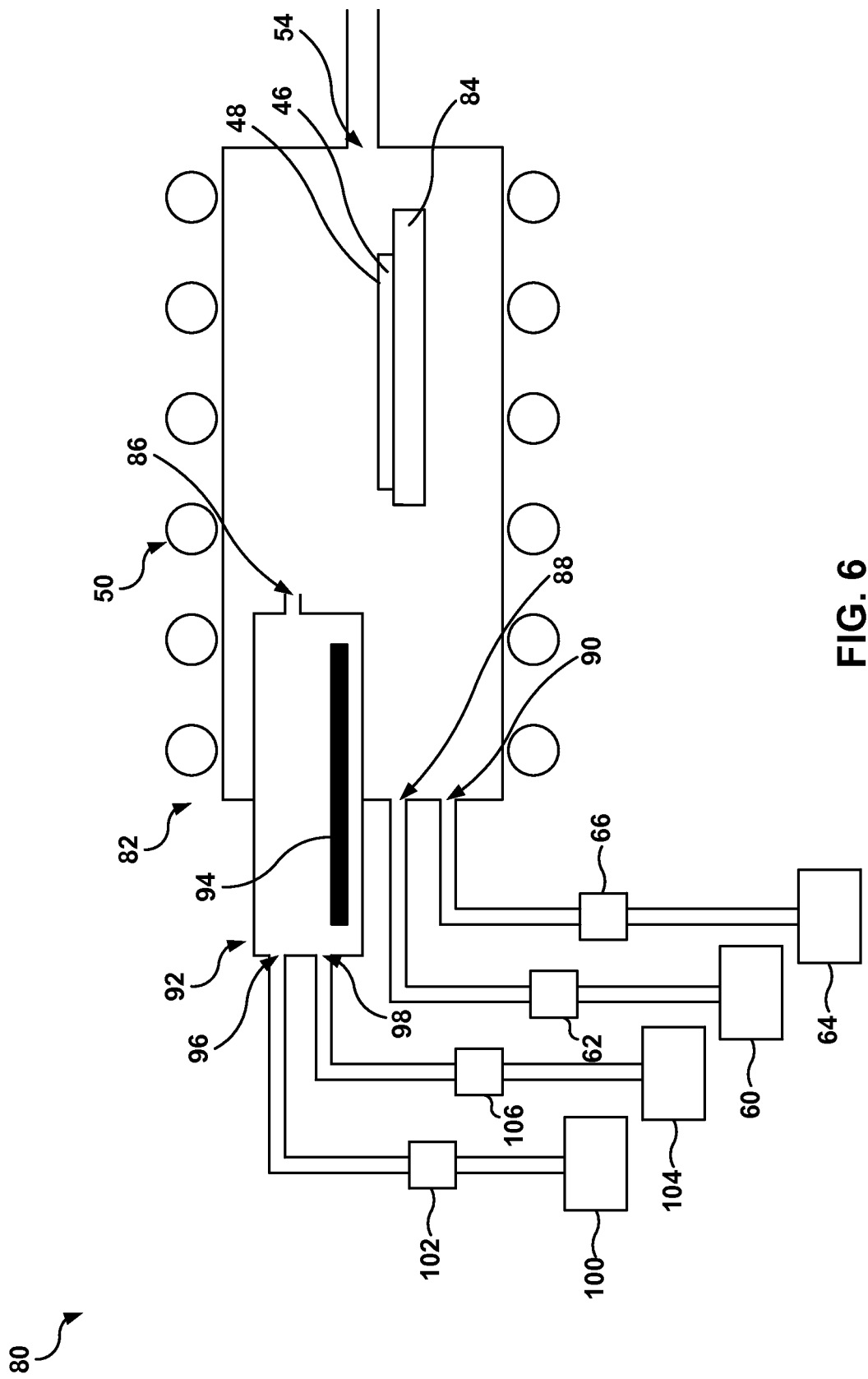
FIG. 6 is a conceptual and schematic diagram illustrating an example chemical vapor deposition system for forming a multilayer hard magnetic material including at least one layer including $\alpha''$-$Fe_{16}N_2$.

Although FIG. 5 illustrates an example system 40 for CVD using a liquid iron-containing material, in other examples, CVD may be performed using a solid iron-containing material. FIG. 6 is a conceptual and schematic diagram illustrating an example chemical vapor deposition system for forming a multilayer hard magnetic material including at least one layer including α"-Fe$_{16}$N$_2$. In some examples, system 80 of FIG. 6 may be similar to or substantially the same as system 40 described with reference to FIG. 5, aside from the differences described herein.

System 80 includes a CVD chamber 82. CVD chamber 82 encloses a susceptor 84, which may be similar or substantially the same as susceptor 44 of FIG. 5. In the example illustrated in FIG. 6, susceptor 84 is not shaped or oriented to position substrate 46 at an incline with respect to inlets 86, 88, and 90. In other examples, susceptor 84 may be shaped or oriented to position substrate 46 at an incline with respect to inlets 86, 88, and 90. CVD chamber 82 may include, for example, quartz or another refractory material. In some examples, CVD chamber 82 may be formed of a material that is substantially transparent to radio frequency (RF) magnetic energy.

CVD chamber 82 is at least partially surrounded by RF induction coils 20. RF induction coils 50 may be similar to or substantially the same as RF induction coils illustrated in FIG. 5. CVD chamber 82 encloses substrate 46, on which multilayer coating 48 is formed. Substrate 46 is disposed on susceptor 84.

In some examples, rather than including a susceptor 84 heated by RF induction coils 50, CVD chamber 82 may be heated such that an entire volume of CVD chamber 82 is heated. For example, CVD chamber 82 may be disposed in a furnace, or CVD chamber 82 may be formed of a material that absorbs RF energy and heats the volume of CVD chamber 82.

CVD chamber 82 may include inlets 86, 88, and 90 and an outlet 54. Inlets 86, 88, and 90 may be fluidically connected to one or more sources of coating gases. For example, in system 80, inlet 86 is fluidically connected to a chamber 92 enclosing a solid iron-containing material 94, inlet 88 is fluidically coupled to a first source 60 of a coating constituent via a valve 62, and inlet 90 is fluidically coupled to a second source 64 of a coating constituent via a valve 66. First source 60, valve 62, second source 64, and valve 66 may be similar to or substantially the same as described above with respect to FIG. 5. For example, first source 60 may include a source of a vapor including a nitrogen-containing compound and second source 64 may include a source of a vapor including a carbon-containing compound (more generally, a source of a vapor including at least one of a carbon-containing compound, a boron-containing compound, or an oxygen-containing compound.

Chamber 92 encloses a solid iron-containing material 94. In some examples, iron-containing material 94 may include an iron-containing powder, billet, or thin film deposited on a substrate. In some examples, the particles in the iron-containing powder may define an average characteristic dimension of on the order of nanometers or micrometers. In some examples, the iron-containing thin film may define a thickness between about 500 nanometers (nm) and about 1 millimeter (mm). In some examples, iron-containing material 94 includes substantially pure iron (e.g., iron with a purity of greater than 90 at. %). In other examples, iron-containing material 94 may include iron oxide (e.g., $Fe_2O_3$ or $Fe_3O_4$).

Chamber 92 may include a first inlet 96 and a second inlet 98. First inlet 96 may fluidically connected to a first gas source 100 by a valve 102. First gas source 100 may include a source of an acid or chloride, such as HCl. The acid or chloride may react with iron-containing material 94 to form an iron-containing vapor. For example, HCl may react with iron-containing material 94 to form iron chloride ($FeCl_3$), which may be heated to form a vapor.

Second inlet 98 may be fluidically coupled to a carrier gas source 104 by a valve 106. In some examples, carrier gas source 104 may include a source of substantially inert gas (e.g., a gas that is substantially non-reactive with other elements and compounds present in system 80 during operation of system 80). A substantially inert gas may include, for example, a noble gas, such as argon.

Valves 62, 66, 102, and 106 may be used to control the total flow rate of gases and vapors into CVD chamber 82, and the relative proportion of carrier gas, nitrogen-containing vapor, carbon-containing vapor, and iron-containing vapor in the gases and vapors flowing into CVD chamber 82. For example, valves 62, 66, 102, and 106 may be controlled to allow deposition of alternating layers from first set of layers 16 and second set of layers 18 to produce multilayer hard magnetic material 14 shown in FIG. 1, and as described with respect to FIG. 5. To form a layer from first set of layers 16, which includes α"-$Fe_{16}N_2$, valves 62, 66, 102, and 106 may be controlled to allow the carrier gas, the vapor including the nitrogen-containing compound, and the vapor including the iron-containing compound to flow into CVD chamber 82, while preventing the vapor including the carbon-containing compound from flowing into CVD chamber 82. In some examples, to form a layer from first set of layers 16, valves 62, 66, 102, and 106 may be controlled to allow the carrier gas, the vapor including the nitrogen-containing compound, and the vapor including the iron-containing compound to flow into CVD chamber 82 to produce an atomic ratio of iron to nitrogen in the gases and vapors flowing into CVD chamber 82 to be between about 11.5:1 (iron:nitrogen) and about 5.65:1 (iron:nitrogen). For example, the atomic ratio between iron and nitrogen atoms in the of the gases and vapors flowing into CVD chamber 82 may be about 9:1 (iron:nitrogen), about 8:1 (iron:nitrogen), or about 6.65:1 (iron:nitrogen).

In some examples, to form a layer from first set of layers 16, the flow rate of the carrier gas may be between about 5 sccm and about 5,000 sccm, the flow rate of the vapor including the nitrogen-containing compound may be between about 10 sccm and about 1,000 sccm, and the flow rate of the vapor including the iron-containing compound may be between about 100 sccm and about 5,000 sccm. Flow rates such as these may result in a growth rate of a layer from first set of layers 16 of between about 100 μm/h and about 1,000 μm/h.

In some examples, the HCl may react with Fe in chamber 92 according to the following reaction:

$$Fe+HCl\rightarrow FeCl_3+H_2$$

The $FeCl_3$ and $H_2$ may flow into CVD chamber 82 through first inlet 86, where the vapors may mix with the nitrogen-containing vapor, such as $NH_3$. In some examples, the nitrogen-containing vapor and the iron containing vapor may react according to the following reaction to deposit a layer of first set of layers 16 including an approximately 8:1 ratio of iron to nitrogen:

$$16FeCl_3+2NH_3+21H_2\rightarrow 2Fe_8N+48HCl$$

In some examples, to form a layer from second set of layers 18, which includes a soft magnetic material, valves 62, 66, 102, and 106 may be controlled to allow the carrier gas and the vapor including the iron-containing compound to flow into CVD chamber 82, while preventing the vapors including the nitrogen-containing compound and the carbon-containing compound from flowing into CVD chamber 82. This may result in a layer including substantially pure iron being deposited.

In other examples, to form a layer from second set of layers 18, valves 62, 66, 102, and 106 may be controlled to allow the carrier gas, the vapor including the nitrogen-containing compound, the vapor including the carbon-containing compound, and the vapor including the iron-containing compound to flow into CVD chamber 82 to produce an atomic ratio of iron to the combination nitrogen and carbon in the gases and vapors flowing into CVD chamber 82 to be between about 11.5:1 (iron:nitrogen+carbon) and about 5.65:1 (iron:nitrogen+carbon). For example, the atomic ratio of iron to the combination of nitrogen and carbon in the gases and vapors flowing into CVD chamber 82 may be about 9:1 (iron:nitrogen+carbon), about 8:1 (iron:nitrogen+carbon), or about 6.65:1 (iron:nitrogen+carbon).

Additionally, valves 62 and 66 may be controlled to control the relative flow rates of the vapor including the nitrogen-containing compound and the vapor including the carbon-containing compound to produce a predetermined atomic ratio of nitrogen to carbon in the gases flowing into CVD chamber 82. For example, valves 62 and 66 may be controlled to control the relative flow rates of the vapor including the nitrogen-containing compound and the vapor including the carbon-containing compound to produce an atomic ratio of nitrogen to carbon of about 0.1:1 and about 10:1, such as about 1:1 or about 4.667:5.333.

In some examples, to form a layer from second set of layers 18, the flow rate of the carrier gas may be between about 5 $cm^3$/minute and about 5,000 $cm^3$/minute, the flow rate of the vapor including the nitrogen-containing compound may be between about 10 $cm^3$/minute and about 1,000 sccm, the flow rate of the vapor including the carbon-containing compound may be between about 0.1 sccm and about 1,000 sccm and the flow rate of the vapor including the iron-containing compound may be between about 100 sccm and about 5,000 sccm. Flow rates such as these may result in a growth rate of a layer from second set of layers 18 of between about 100 μm/h and about 1,000 μm/h.

In some examples, the HCl may react with Fe in chamber 92 according to the following reaction:

$$Fe+HCl\rightarrow FeCl_3+H_2$$

The $FeCl_3$ and $H_2$ may flow into CVD chamber 82 through first inlet 86, where the vapors may mix with the nitrogen-containing vapor, such as $NH_3$. In some examples, the nitrogen-containing vapor and the iron containing vapor may react according to the following reaction to deposit a layer of second set of layers 18 including an approximately 8:1 ratio of iron to nitrogen plus carbon:

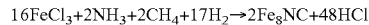

$16\text{FeCl}_3 + 2\text{NH}_3 + 2\text{CH}_4 + 17\text{H}_2 \rightarrow 2\text{Fe}_8\text{NC} + 48\text{HCl}$ As described above with respect to FIG. 5, once multilayer coating 48 has been formed to a predetermined thickness, multilayer coating 48 may be annealed to transform at least some of the iron nitride mixture in layers of first set of layers 16 to $\alpha''\text{-Fe}_{16}\text{N}_2$ and transform at least some of the iron-carbide-nitride mixture in layers of second set of layers 18 to $\alpha''\text{-Fe}_{16}(\text{N}_x\text{Z}_{1-x})_2$ or a mixture of $\alpha''\text{-Fe}_{16}\text{N}_2$ and $\alpha''\text{-Fe}_{16}\text{Z}_2$, where Z includes at least one of carbon, boron, or oxygen. The annealing technique may be similar to or substantially the same as that described above with respect to FIG. 5.

By using CVD to form multilayer hard magnetic material 14 on substrate 46, multilayer hard magnetic material 14 may be incorporated into other products formed using CVD and existing manufacturing techniques that utilize CVD. Using existing CVD manufacturing operations, including masking, multilayer hard magnetic material 14 may be deposited on predetermined portions or regions of substrate 46. For example, multilayer hard magnetic materials 14 may be incorporated into CMOS (complementary metal-oxide-semiconductor) integrated circuit devices, and the CVD technique for forming multilayer hard magnetic materials 42 may be incorporated into existing CMOS processing techniques. In other examples, multilayer hard magnetic materials 14 formed using CVD may be incorporated into other devices utilizing hard magnetic materials, such as electric motors, electric generators, transformers, magnetic recording media, magnetic resonance imaging (MRI) magnets, MRAM, magnetic logic devices, magnetic MEMS, and micro actuators, among other applications.

CVD may allow growth of multilayer coating 48 faster than some other techniques, such as molecular beam epitaxy (MBE), while, in some examples, forming superior coatings compared to some other techniques, such as sputtering.

In other examples, a coating (e.g., multilayer coating 48) may be formed on a substrate (e.g., substrate 46) using liquid phase epitaxy (LPE). In LPE, a solution including the coating materials may be cooled to form a supersaturated solution. The coating materials in the solution deposit a coating on a substrate immersed or submerged in the solution. In some examples, the degree of supersaturation may be low, such that the LPE technique is a near-equilibrium process. This may result in coatings with high crystalline quality (e.g., near-perfect crystalline structure). Additionally, because the concentration of the coating materials in the solution are much greater than the concentration of coating materials in vapor phase techniques, the growth rate of the coating may be greater than the growth rate for coatings grown using vapor phase techniques.

Figure 7:
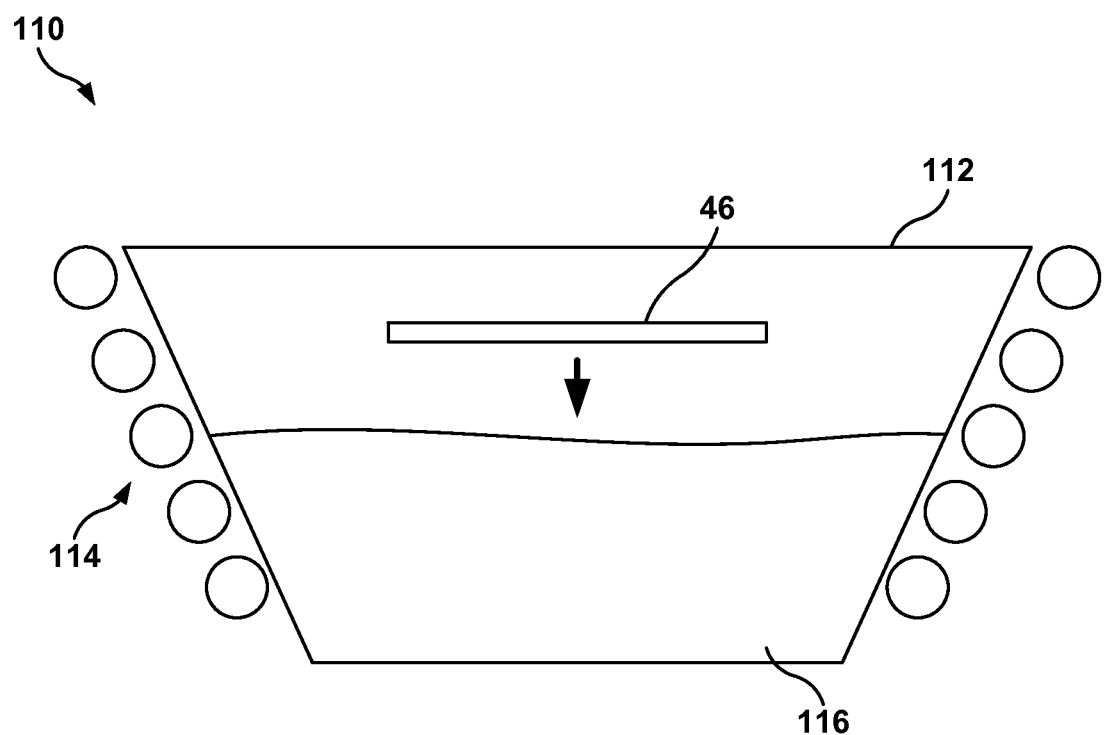
FIG. 7 is a conceptual and schematic diagram illustrating an example system for forming a multilayer coating including at least one layer including iron nitride and at least one layer including iron, nitrogen, and carbon over a substrate using LPE.

FIG. 7 is a conceptual and schematic diagram illustrating an example system 110 for forming a multilayer coating including at least one layer including iron nitride and at least one layer including iron, nitrogen, and carbon on a substrate 46 using LPE. System 110 includes a crucible 112 in which a coating solution 116 is contained. System 110 also includes RF induction coils 114, which at least partially surrounded crucible 112. RF induction coils 114 may be electrically connected to an RF source (not shown in FIG. 7), which causes an alternating electrical current at RF to flow through RF induction coils 114. In some examples, the RF magnetic field generated by RF induction coils 114 may be absorbed by coating solution 116 or by crucible 112, such that coating solution 116 is heated.

Coating solution 116 may include a solution of iron in a solvent. Coating solution 116 may include a first solution when forming a layer including iron and nitrogen and a second, different solution when forming a layer including iron, carbon, and nitrogen.

In some examples when forming a layer including iron and nitrogen, the solvent may include a nitrogen-containing compound, such as an ammonium nitrate, urea, an amide, or hydrazine. In some examples, the solvent may be oversaturated with nitrogen at the deposition temperature and pressure. Example amides include carbamide (($\text{NH}_2$)$_2$CO; also referred to as urea), methanamide (Formula 1 above), benzamide (Formula 2 above), acetamide (Formula 3 above), and acid amides, although any amide may be used. The amide may be selected to be a liquid at the temperatures experienced by coating solution 116 during the LPE technique.

Coating solution 116 also includes an iron source. In some examples, the iron source may include an iron-containing compound. In some examples, the iron source includes a liquid iron donor, such as $\text{FeCl}_3$ or $\text{Fe(CO)}_5$. In other examples, the iron source may include an iron-containing powder. In some examples, the iron-containing powder may include substantially pure iron (e.g., iron with a purity of greater than 90 at. %). In some examples, the iron-containing powder may include iron oxide (e.g., $\text{Fe}_2\text{O}_3$ or $\text{Fe}_3\text{O}_4$).

Figure 8:
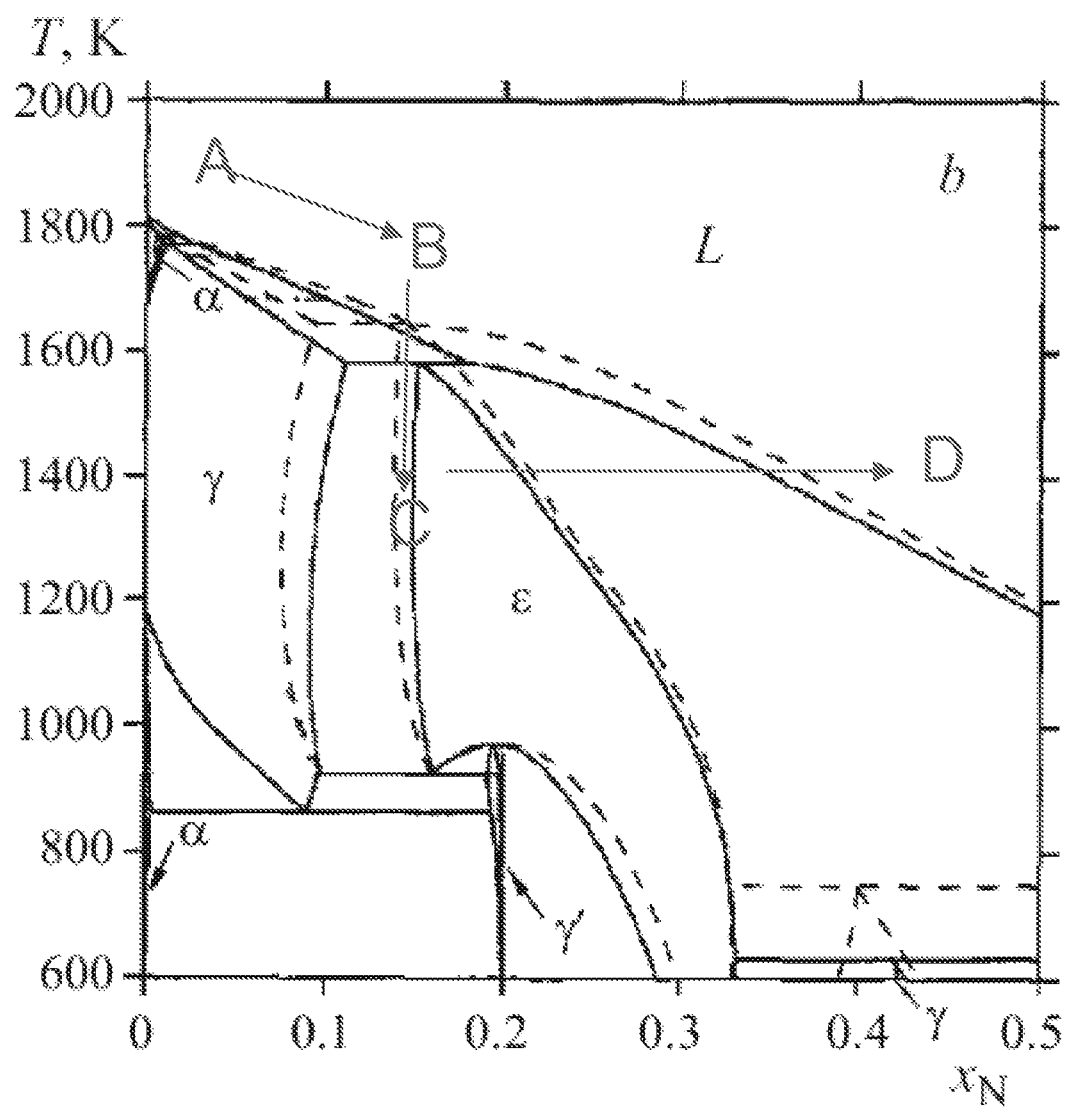
FIG. 8 is an example liquid-solid iron-nitrogen phase diagram.

During the LPE process for forming a layer including iron and nitrogen, the coating solution 116 may be heated to a temperature above the liquidus temperature of the liquid-solid iron-nitrogen phase diagram shown in FIG. 8. For example, the solvent may be heated to the temperature indicated by point A in the liquid-solid iron-nitrogen phase diagram. In some examples, the solvent may not include the iron source when heated to the temperature indicated by point A.

The iron source or iron-containing material then may be dissolved in the solvent to form a coating solution 116 that is saturated with the iron-containing material. This saturated solution is indicated by point B on the in the liquid-solid iron-nitrogen phase diagram. Substrate 46 then may be immersed in coating solution 116.

Coating solution 116 and substrate 46 then may be cooled to a temperature, indicated by point C, that is below the liquidus temperature of the iron-nitrogen coating to be formed. This causes coating solution 116 to be supersaturated with the iron-containing material, which drives the LPE coating technique. In some examples, the temperature indicated by point C, at which the LPE coating technique is performed, may be between about 600° C. and about 800° C. (although point C indicates a higher temperature). Point C is in the two-phase region, which provides a driving force for precipitation of iron nitride on the surface of substrate 46, until point D on the liquidus line is reached, where precipitation ends. In some examples, the concentration of iron and nitrogen in coating solution 86 and the temperature at which the LPE coating technique is performed may be controlled to provide an atomic ratio of iron to nitrogen between about 11.5:1 (iron:nitrogen) and about 5.65:1 (iron:nitrogen). For example, the atomic ratio between iron and nitrogen atoms may be about 9:1 (iron:nitrogen), about 8:1 (iron:nitrogen), or about 6.65:1 (iron:nitrogen).

Once the coating including iron and nitrogen is formed by LPE, substrate 46 may be removed from crucible 112.

A second coating solution 116 may be formed for forming a layer including iron, carbon, and nitrogen. In some examples when forming a layer including iron, carbon and nitrogen, the solvent may include a nitrogen-containing compound, such as ammonium nitrate, urea, an amide, or hydrazine. In some examples, the solvent may be oversaturated with nitrogen at the deposition temperature and pressure. Example amides include carbamide (($NH_2$)$_2$CO; also referred to as urea), methanamide (Formula 1 above), benzamide (Formula 2 above), acetamide (Formula 3 above), and acid amides, although any amide may be used. The amide may be selected to be a liquid at the temperatures experienced by coating solution 116 during the LPE technique.

Coating solution 116 also may include a carbon-containing compound. For example, coating solution 116 may include dissolved carbon monoxide, dissolved carbon dioxide, dissolved methane, or urea. In some examples, the carbon-containing compound and the nitrogen-containing compound may be the same (e.g., urea).

Coating solution 116 also includes an iron source. In some examples, the iron source may include an iron-containing compound. In some examples, the iron source includes at least one of $FeCl_3$, $Fe(CO)_5$, substantially pure iron (e.g., iron with a purity of greater than 90 at. %), $Fe_2O_3$, or $Fe_3O_4$).

During the LPE process for forming a layer including iron, carbon, and nitrogen, the coating solution 116 may be heated to a temperature above the liquidus temperature of the iron, carbon, and nitrogen mixture to be deposited on substrate 46. In some examples, the solvent may not include the iron source, the carbon source, or both when heated to the temperature above the liquidus temperature.

The iron source and carbon source then may be dissolved in the solvent to form a coating solution 116 that is saturated with the iron-containing material, the carbon source, or both. Substrate 46 then may be immersed in coating solution 116.

Coating solution 116 and substrate 46 then may be cooled to a temperature that is below the liquidus temperature of the iron-carbon-nitrogen coating to be formed. This causes coating solution 116 to be supersaturated with the iron-containing material, the carbon-containing material, or both, which drives the LPE coating technique. In some examples the temperature at which the LPE coating technique is performed may be between about 600° C. and about 1000° C. This temperature may be in a two-phase region, which provides a driving force for precipitation of iron-carbon-nitrogen on the surface of substrate 12. In some examples, the concentration of iron, carbon, and nitrogen in coating solution 116 and the temperature at which the LPE coating technique is performed may be controlled to provide an atomic ratio of iron to nitrogen plus carbon between about 11.5:1 (iron:(nitrogen+carbon)) and about 5.65:1 (iron:(nitrogen+carbon)). For example, the atomic ratio between iron and nitrogen atoms may be about 9:1 (iron:(nitrogen+carbon)), about 8:1 (iron:(nitrogen+carbon)), or about 6.65:1 (iron:(nitrogen+carbon)).

After the multilayer coating that includes at least one layer including iron and nitrogen and at least one layer including iron, carbon, and nitrogen, the multilayer coating may be annealed under conditions similar to or substantially the same as those described with respect to FIG. 5. The annealing may facilitate formation of $\alpha''\text{-}Fe_{16}N_2$ in the layers including iron and nitrogen and formation of $\alpha''\text{-}Fe_{16}(N_xZ_{1-x})_2$ phase (where Z includes at least one of C, B, or O) or a mixture of $\alpha''\text{-}Fe_{16}N_2$ phase and $\alpha''\text{-}Fe_{16}Z_2$ phase in the layers including iron, Z atoms (e.g., carbon), and nitrogen to form multilayer hard magnetic material 14 shown in FIG. 1.

Because $\alpha''\text{-}Fe_{16}N_2$ has high saturation magnetization and magnetic anisotropy constant. The high saturation magnetization and magnetic anisotropy constants result in a magnetic energy product that may be higher than rare earth magnets. For example, experimental evidence gathered from thin film $\alpha''\text{-}Fe_{16}N_2$ permanent magnets suggests that bulk $Fe_{16}N_2$ permanent magnets may have desirable magnetic properties, including an energy product of as high as about 134 MegaGauss*Oerstads (MGOe), which is about two times the energy product of NdFeB (which has an energy product of about 60 MGOe). Additionally, iron and nitrogen are abundant elements, and thus are relatively inexpensive and easy to procure. The high energy product of $\alpha''\text{-}Fe_{16}N_2$ magnets may be used in electric motors, electric generators, transformers, magnetic recording media, and magnetic resonance imaging (MRI) magnets, among other applications. In the multilayer hard magnetic material 14 (FIG. 1), layers of first set of layers 16, which include $\alpha''\text{-}Fe_{16}N_2$ may be exchange-spring coupled to layers of second set of layers 18, which include a soft magnetic material. In this way, multilayer hard magnetic material 14 may have similar magnetic properties to a material consisting of $\alpha''\text{-}Fe_{16}N_2$.

When ranges are used herein for physical properties, such as molecular weight, or chemical properties, such as chemical formulae, all combinations and subcombinations of ranges for specific examples therein are intended to be included.

This patent application is related to International Patent Application No. PCT/US2012/051382, filed Aug. 17, 2012; International Patent Application No. PCT/US2014/015104, filed Feb. 6, 2014; and International Patent Application No. PCT/US2014/043902, filed Jun. 24, 2014. The entire contents of these international patent applications are incorporated herein by reference.

The disclosure of each patent, patent application, and publication cited or described in this document are hereby incorporated herein by reference, in its entirety.

Clause 1: A method comprising: heating an iron source to form a vapor comprising an iron-containing compound; depositing iron from the vapor comprising the iron-containing compound and nitrogen from a vapor comprising a nitrogen-containing compound over a substrate to form a first layer comprising iron and nitrogen; depositing iron from the vapor comprising the iron-containing compound, nitrogen from the vapor comprising nitrogen-containing compound, and at least one of carbon, boron, or oxygen from a vapor comprising the at least one of carbon, boron, or oxygen over the substrate to form a second layer comprising iron, nitrogen, and the at least one of carbon, boron, or oxygen; and annealing the first layer to form at least some crystals comprising $\alpha''\text{-}Fe_{16}N_2$ and the second layer to form at least some crystals comprising $\alpha''\text{-}Fe_{16}(N_xZ_{1-x})_2$, wherein Z comprises the at least one of carbon, boron, or oxygen, and wherein x is a number greater than zero and less than one.

Clause 2: A method comprising: heating an iron source to form a vapor comprising an iron-containing compound; depositing iron from the vapor comprising the iron-containing compound and nitrogen from a vapor comprising a nitrogen-containing compound over a substrate to form a first layer comprising iron and nitrogen; depositing iron from the vapor comprising the iron-containing compound, nitrogen from the vapor comprising the nitrogen-containing compound, and at least one of carbon, boron, or oxygen from a vapor comprising the at least one of carbon, boron, or oxygen on over the substrate to form a second layer comprising iron, nitrogen, and the at least one of carbon, boron, or oxygen; and annealing the first layer to form at least some crystals comprising $\alpha''$-$Fe_{16}N_2$ and the second layer to form at least some crystals comprising $\alpha''$-$Fe_{16}N_2$ and at least some crystals comprising $\alpha''$-$Fe_{16}Z_2$, wherein Z comprises the at least one of carbon, boron, or oxygen.

Clause 3: The method of clause 1 or 2, wherein the first layer is formed on the substrate and the second layer is formed on the first layer.

Clause 4: The method of clause 1 or 2, wherein the second layer is formed on the substrate and the first layer is formed on the second layer.

Clause 5: The method of any one of clauses 1 to 4, wherein the iron source comprises solid iron.

Clause 6: The method of any one of clauses 1 to 4, wherein the solid iron comprises at least one of iron powder or an iron thin film.

Clause 7: The method of any one of clauses 1 to 4, wherein iron source comprises a solid iron precursor.

Clause 8: The method of clause 7, wherein the solid iron precursor comprises at least one of $Fe_2O_3$ powder or $Fe_2O_4$ powder.

Clause 9: The method of any one of clauses 1 to 4, wherein the iron source comprises a liquid iron precursor.

Clause 10: The method of clause 9, wherein the liquid iron precursor comprises at least one of $FeCl_3$ or $Fe(CO)_5$.

Clause 11: The method of any one of clauses 1 to 10, wherein the vapor comprising the nitrogen-containing compound is formed by at least heating urea to form a vapor including urea.

Clause 12: The method of any one of clauses 1 to 10, wherein the vapor comprising the nitrogen-containing compound is formed by at least heating at least one of an amide or hydrazine to form the vapor comprising the nitrogen-containing compound.

Clause 13: The method of any one of clauses 1 to 10, wherein the vapor comprising the nitrogen-containing compound comprises $NH_3$ vapor.

Clause 14: The method of any one of clauses 1 to 10, wherein the vapor comprising the nitrogen-containing compound comprises atomic nitrogen formed from diatomic nitrogen using a plasma.

Clause 15: The method of any one of clauses 1 to 14, wherein providing the vapor comprising the at least one of carbon, boron, or oxygen comprises heating a solid source of carbon to form a vapor comprising carbon.

Clause 16: The method of clause 15, wherein the solid source of carbon comprises at least one of pure carbon or urea.

Clause 17: The method of any one of clauses 1 to 14, wherein the vapor comprising the at least one of carbon, boron, or oxygen comprises a vapor comprising at least one of carbon monoxide, carbon dioxide, or methane.

Clause 18: The method of any one of clauses 1 to 17, further comprising heating the vapor comprising the iron-containing compound and the vapor comprising the nitrogen-containing compound to decompose the vapor comprising the iron-containing compound and the vapor comprising the nitrogen-containing compound to form atomic nitrogen and atomic iron, which deposit on the substrate in the first layer.

Clause 19: The method of any one of clauses 1 to 18, further comprising heating the substrate above a decomposition temperature of at least one of the vapor comprising the iron-containing compound and the vapor comprising the nitrogen-containing compound such that atomic nitrogen and atomic iron deposit on the substrate in the first layer.

Clause 20: The method of any one of clauses 1 to 19, further comprising heating the vapor comprising the iron-containing compound, the vapor comprising the nitrogen-containing compound, and the vapor comprising the at least one of carbon, boron, or oxygen to decompose the vapor comprising the iron-containing compound, the vapor comprising the nitrogen-containing compound, and the vapor comprising the at least one of carbon, boron, or oxygen to form atomic nitrogen, atomic iron, and atoms of the at least one of carbon, boron, or oxygen, which deposit on the substrate in the second layer.

Clause 21: The method of any one of clauses 1 to 20, further comprising heating the substrate above a decomposition temperature of at least one of the vapor comprising the iron-containing compound, the vapor comprising the nitrogen-containing compound, and the vapor comprising the at least one of carbon, boron, or oxygen such that atomic nitrogen, atomic iron, and atoms of the at least one of carbon, boron, or oxygen deposit on the substrate in the second layer.

Clause 22: The method of any one of clauses 1 to 21, wherein annealing the first layer and the second layer comprises heating the layer at a temperature between about 100° C. and about 300° C. for between about 5 hours and 80 hours.

Clause 23: The method of any one of clauses 1 to 22, wherein the substrate comprises at least one of silicon, GaAs, SiC, InGaAs, MgO, $SiO_2$, glass, or a high temperature polymer.

Clause 24. A method comprising: submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution; cooling the first coating solution to a second temperature to form a supersaturated first coating solution, wherein the second temperature is below the liquidus temperature of the iron-nitrogen mixture; maintaining the substrate in the supersaturated first coating solution to allow a first layer comprising iron and nitrogen to form over the substrate; submerging the substrate in a second coating solution comprising a nitrogen-containing solvent, an iron source, and a compound containing at least one of carbon, boron, or oxygen, wherein the second coating solution is saturated with the iron source at a third temperature above a liquidus temperature of a mixture to be deposited from the second coating solution; cooling the second coating solution to a fourth temperature to form a supersaturated second coating solution, wherein the fourth temperature is below the liquidus temperature of the mixture; maintaining the substrate in the supersaturated second coating solution to allow a second layer comprising iron, nitrogen, and the at least one of carbon, boron, or oxygen to form over the substrate; annealing the first layer to form at least some crystals comprising $\alpha''$-$Fe_{16}N_2$ and the second layer to form at least some crystals comprising $\alpha''$-$Fe_{16}(N_xZ_{1-x})_2$, wherein Z comprises the at least one of carbon, boron, or oxygen, and wherein x is a number greater than zero and less than one.

Clause 25: A method comprising: submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution; cooling the first coating solution to a second temperature to form a supersaturated first coating solution, wherein the second temperature is below the liquidus temperature of the iron-nitrogen mixture; maintaining the substrate in the supersaturated first coating solution to allow a first layer comprising iron and nitrogen to form over the substrate; submerging the substrate in a second coating solution comprising a nitrogen-containing solvent, an iron source, and a compound containing at least one of carbon, boron, or oxygen, wherein the second coating solution is saturated with the iron source at a third temperature above a liquidus temperature of a mixture to be deposited from the second coating solution; cooling the second coating solution to a fourth temperature to form a supersaturated second coating solution, wherein the fourth temperature is below the liquidus temperature of the mixture; maintaining the substrate in the supersaturated second coating solution for a period of time to allow a second layer comprising iron, nitrogen, and the at least one of carbon, boron, or oxygen to form over the substrate; and annealing the first layer to form at least some crystals comprising $\alpha''\text{-Fe}_{16}N_2$ and the second layer to form at least some crystals comprising a mixture of $\alpha''\text{-Fe}_{16}N_2$ and $\alpha''\text{-Fe}_{16}Z_2$, wherein Z comprises the at least one of carbon, boron, or oxygen.

Clause 26: The method of clause 24 or 25, wherein the first layer is formed on the substrate and the second layer is formed on the first layer.

Clause 27: The method of clause 24 or 25, wherein the second layer is formed on the substrate and the first layer is formed on the second layer.

Clause 28: The method of any one of clauses 24 to 27, wherein the solvent comprises at least one of an amide or hydrazine.

Clause 29: The method of any one of clauses 24 to 28, wherein the iron source comprises at least one of substantially pure iron, $FeCl_3$, $Fe(CO)_5$, or an iron oxide.

Clause 30: The method of any one of clauses 24 to 29, wherein the second temperature is between about 600° C. and about 800° C.

Clause 31: The method of any one of clauses 24 to 30, wherein the first coating comprises an atomic ratio of iron to nitrogen between about 11.5:1 (iron:nitrogen) and about 5.65:1 (iron:nitrogen).

Clause 32: The method of any one of clauses 24 to 30, wherein the first coating comprises an atomic ratio of iron to nitrogen of about 8:1 (iron:nitrogen).

Clause 33. The method of any one of clauses 24 to 32, wherein the second coating comprises an atomic ratio of iron to nitrogen plus the at least one of carbon, boron, or oxygen between about 11.5:1 and about 5.65:1.

Clause 34: The method of any one of clauses 24 to 32, wherein the second coating comprises an atomic ratio of iron to nitrogen plus the at least one of carbon, boron, or oxygen of about 8:1.

Clause 35: The method of any one of clauses 24 to 34, wherein annealing the first coating to form at least some crystals comprising $\alpha''\text{-Fe}_{16}N_2$ and the second coating to form at least some crystals comprising $\alpha''\text{-Fe}_{16}(N_xZ_{1-x})_2$ or a mixture of $\alpha''\text{-Fe}_{16}N_2$ and $\alpha''\text{-Fe}_{16}Z_2$ comprises heating the first coating and the second coating at a temperature between about 100° C. and about 300° C. for between about 5 hours and about 80 hours.

Clause 36: The method of any one of clauses 24 to 35, wherein the substrate comprises at least one of silicon, GaAs, SiC, InGaAs, MgO, $SiO_2$, glass, or a high temperature polymer.

Clause 37: An article formed by the method of any one of clauses 1 to 36.

Clause 38: An article comprising: a first set of layers, each layer of the first set of layers comprising $\alpha''\text{-Fe}_{16}N_2$; and a second set of layers, each layer of the second set of layers comprising a mixture of $\alpha''\text{-Fe}_{16}N_2$ and $\alpha''\text{-Fe}_{16}Z_2$, wherein Z comprises at least one of C, B, or O, wherein one or more respective layers of the first set of layers alternate with one or more respective layers of the second set of layers.

Clause 39: The article of clause 38, wherein the ratio of $\alpha''\text{-Fe}_{16}N_2$ to $\alpha''\text{-Fe}_{16}Z_2$ in each layer of the second set of layers is about 1:1.

Clause 40: An article comprising: a first set of layers, each layer of the first set of layers comprising $\alpha''\text{-Fe}_{16}N_2$; and a second set of layers, each layer of the second set of layers comprising $\alpha''\text{-Fe}_{16}(N_xZ_{1-x})_2$, wherein Z comprises at least one of C, B, or O, wherein x is a number greater than 0 and less than one, and wherein one or more respective layers of the first set of layers alternate with one or more respective layers of the second set of layers.

Clause 41: The article of clause 40, wherein x is equal to about 0.5.

Clause 42: The article of any one of clauses 38 to 41, further comprising a substrate comprising at least one of a high temperature polymer, silicon, GaAs, SiC, InGaAs, MgO, $SiO_2$, or glass, wherein the first set of layers and the second set of layers are formed on the substrate.

Clause 43: The article of any one of clauses 38 to 42, wherein the one or more respective layers of the second set of layers are magnetically coupled to the one or more respective layers of the first set of layers by exchange spring coupling.

Various examples have been described. Those skilled in the art will appreciate that numerous changes and modifications can be made to the examples described in this disclosure and that such changes and modifications can be made without departing from the spirit of the disclosure. These and other examples are within the scope of the following claims.

What is claimed is:

1. An article comprising a hard magnetic material, the hard magnetic material comprising:
    a first set of layers, each layer of the first set of layers comprising $\alpha''\text{-Fe}_{16}N_2$; and
    a second set of layers, each layer of the second set of layers comprising at least one of:
        a mixture of $\alpha''\text{-Fe}_{16}N_2$ and $\alpha''\text{-Fe}_{16}Z_2$, wherein Z comprises at least one of C, B, or O; or
        $\alpha''\text{-Fe}_{16}(N_xZ_{1-x})_2$, wherein Z comprises at least one of C, B, or O, wherein x is a number greater than 0 and less than one, and wherein one or more respective layers of the first set of layers alternate with one or more respective layers of the second set of layers.

2. The article of claim 1, wherein at least one layer of the second set of layers comprises the mixture of $\alpha''\text{-Fe}_{16}N_2$ and $\alpha''\text{-Fe}_{16}Z_2$, and wherein the ratio of $\alpha''\text{-Fe}_{16}N_2$ to $\alpha''\text{-Fe}_{16}Z_2$ in the at least one layer of the second set of layers is about 1:1 or is about 4.667:5.333.

3. The article of claim 1, wherein at least one layer of the second set of layers comprises $\alpha''\text{-Fe}_{16}(N_xZ_{1-x})_2$, and wherein x is equal to about 0.5 or is equal to about 0.4667.

4. The article of claim 1, wherein the one or more respective layers of the second set of layers are magnetically coupled to the one or more respective layers of the first set of layers by exchange spring coupling.

5. The article of claim 1, further comprising at least one of a ferromagnetic dopant, a nonmagnetic dopant, or a phase stabilizer.

6. The article of claim 1, wherein at least one layer of the first set of layers further comprises at least one domain comprising a soft magnetic material, and wherein the α"-Fe$_{16}$N$_2$ in the at least one layer of the first set of layers is magnetically coupled to the at least one domain comprising a soft magnetic material.

7. The article of claim 1, wherein the article is an electric motor, a generator, a sensor, an actuator, a component of an automotive vehicle or a component of a wind turbine.

8. A method of forming the article of claim 1 comprising:
heating an iron source to form a vapor comprising an iron-containing compound;
depositing iron from the vapor comprising the iron-containing compound and nitrogen from a vapor comprising a nitrogen-containing compound over a substrate to form a first layer comprising iron and nitrogen;
depositing iron from the vapor comprising the iron-containing compound, nitrogen from the vapor comprising nitrogen-containing compound, and at least one of carbon, boron, or oxygen from a vapor comprising the at least one of carbon, boron, or oxygen over the substrate to form a second layer comprising iron, nitrogen, and the at least one of carbon, boron, or oxygen; and
annealing the first layer to form at least some crystals comprising α"-Fe$_{16}$N$_2$ and the second layer to form at least some crystals comprising α"-Fe$_{16}$(N$_x$Z$_{1-x}$)$_2$ or a mixture of α"-Fe$_{16}$N$_2$ crystals and α"-Fe$_{16}$Z$_2$ crystals, wherein Z comprises the at least one of carbon, boron, or oxygen, and wherein x is a number greater than zero and less than one.

9. The method of claim 8, wherein the first layer is formed on the substrate and the second layer is formed on the first layer.

10. The method of claim 8, wherein the second layer is formed on the substrate and the first layer is formed on the second layer.

11. The method of claim 8, wherein the iron source comprises solid iron, and wherein the solid iron comprises at least one of iron powder or an iron thin film.

12. The method of claim 8, wherein iron source comprises a solid iron precursor, and wherein the solid iron precursor comprises at least one of Fe$_2$O$_3$ powder or Fe$_2$O$_4$ powder.

13. The method of claim 8, wherein the iron source comprises a liquid iron precursor, and wherein the liquid iron precursor comprises at least one of FeCl$_3$ or Fe(CO)$_5$.

14. The method of claim 8, wherein the vapor comprising the nitrogen-containing compound is formed by at least heating urea to form a vapor including urea.

15. The method of claim 8, wherein the vapor comprising the nitrogen-containing compound is formed by at least heating at least one of an amide or hydrazine to form the vapor comprising the nitrogen-containing compound.

16. The method of claim 8, wherein the vapor comprising the nitrogen-containing compound comprises NH$_3$ vapor.

17. The method of claim 8, wherein the vapor comprising the nitrogen-containing compound comprises atomic nitrogen formed from diatomic nitrogen using a plasma.

18. The method of claim 8, wherein providing the vapor comprising the at least one of carbon, boron, or oxygen comprises heating a solid source of carbon comprising at least one of pure carbon or urea to form a vapor comprising carbon.

19. The method of claim 8, wherein the vapor comprising the at least one of carbon, boron, or oxygen comprises a vapor comprising at least one of carbon monoxide, carbon dioxide, or methane.

20. The method of claim 8, further comprising heating the vapor comprising the iron-containing compound and the vapor comprising the nitrogen-containing compound to decompose the vapor comprising the iron-containing compound and the vapor comprising the nitrogen-containing compound to form atomic nitrogen and atomic iron, which deposit on the substrate in the first layer.

21. The method of claim 8, further comprising heating the substrate above a decomposition temperature of at least one of the vapor comprising the iron-containing compound and the vapor comprising the nitrogen-containing compound such that atomic nitrogen and atomic iron deposit on the substrate in the first layer.

22. The method of claim 8, further comprising heating the vapor comprising the iron-containing compound, the vapor comprising the nitrogen-containing compound, and the vapor comprising the at least one of carbon, boron, or oxygen to decompose the vapor comprising the iron-containing compound, the vapor comprising the nitrogen-containing compound, and the vapor comprising the at least one of carbon, boron, or oxygen to form atomic nitrogen, atomic iron, and atoms of the at least one of carbon, boron, or oxygen, which deposit on the substrate in the second layer.

23. The method of claim 8, further comprising heating the substrate above a decomposition temperature of at least one of the vapor comprising the iron-containing compound, the vapor comprising the nitrogen-containing compound, and the vapor comprising the at least one of carbon, boron, or oxygen such that atomic nitrogen, atomic iron, and atoms of the at least one of carbon, boron, or oxygen deposit on the substrate in the second layer.

24. The method of claim 8, wherein annealing the first layer and the second layer comprises heating the layer at a temperature between about 100° C. and about 300° C. for between about 5 hours and 80 hours.

25. A method of forming the article of claim 1 comprising:
submerging a substrate in a first coating solution comprising a nitrogen-containing solvent and an iron source, wherein the first coating solution is saturated with the iron source at a first temperature above a liquidus temperature of an iron-nitrogen mixture to be deposited from the first coating solution;
cooling the first coating solution to a second temperature to form a supersaturated first coating solution, wherein the second temperature is below the liquidus temperature of the iron-nitrogen mixture;
maintaining the substrate in the supersaturated first coating solution to allow a first layer comprising iron and nitrogen to form over the substrate;
submerging the substrate in a second coating solution comprising a nitrogen-containing solvent, an iron source, and a compound containing at least one of carbon, boron, or oxygen, wherein the second coating solution is saturated with the iron source at a third temperature above a liquidus temperature of a mixture to be deposited from the second coating solution;
cooling the second coating solution to a fourth temperature to form a supersaturated second coating solution, wherein the fourth temperature is below the liquidus temperature of the mixture;
maintaining the substrate in the supersaturated second coating solution to allow a second layer comprising iron, nitrogen, and the at least one of carbon, boron, or oxygen to form over the substrate;
annealing the first layer to form at least some crystals comprising α"-Fe$_{16}$N$_2$ and the second layer to form at least some crystals comprising α"-Fe$_{16}$(N$_x$Z$_{1-x}$)$_2$ or a mixture of α"-Fe$_{16}$N$_2$ crystals and α"-Fe$_{16}$Z$_2$ crystals, wherein Z comprises the at least one of carbon, boron, or oxygen, and wherein x is a number greater than zero and less than one.

26. The method of claim 25, wherein the first layer is formed on the substrate and the second layer is formed on the first layer.

27. The method of claim 25, wherein the second layer is formed on the substrate and the first layer is formed on the second layer.

28. The method of claim 25, wherein the solvent comprises at least one of an amide or hydrazine, and wherein the iron source comprises at least one of substantially pure iron, $FeCl_3$, $Fe(CO)_5$, or an iron oxide.

29. The method of claim 25, wherein the second temperature is between about 600° C. and about 800° C.

30. The method of claim 25, wherein the first coating comprises an atomic ratio of iron to nitrogen between about 11.5:1 (iron:nitrogen) and about 5.65:1 (iron:nitrogen).

31. The method of claim 25, wherein the second coating comprises an atomic ratio of iron to nitrogen plus the at least one of carbon, boron, or oxygen between about 11.5:1 and about 5.65:1.

32. The method of claim 25, wherein annealing the first coating to form at least some crystals comprising $\alpha''\text{-}Fe_{16}N_2$ and the second coating to form at least some crystals comprising $\alpha''\text{-}Fe_{16}(N_xZ_{1-x})_2$ or a mixture of $\alpha''\text{-}Fe_{16}N_2$ and $\alpha''\text{-}Fe_{16}Z_2$ comprises heating the first coating and the second coating at a temperature between about 100° C. and about 300° C. for between about 5 hours and about 80 hours.

* * * * *